(12) United States Patent
Takei

(10) Patent No.: US 7,116,461 B2
(45) Date of Patent: Oct. 3, 2006

(54) ELECTRO-OPTIC DEVICE, METHOD FOR MANUFACTURING THE SAME, AND ELECTRONIC APPARATUS

(75) Inventor: Shuichi Takei, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/777,309

(22) Filed: Feb. 13, 2004

(65) Prior Publication Data

US 2004/0174321 A1    Sep. 9, 2004

(30) Foreign Application Priority Data

Feb. 17, 2003  (JP)  ............................. 2003-038287
Mar. 4, 2003   (JP)  ............................. 2003-056966
Dec. 16, 2003  (JP)  ............................. 2003-417953

(51) Int. Cl.
*G02F 1/03*    (2006.01)
*H05B 33/12*   (2006.01)

(52) U.S. Cl. ...................... 359/245; 428/690
(58) Field of Classification Search ................ 359/245, 359/248, 253, 254; 341/100; 428/690, 917; 136/257; 257/89; 427/66
See application file for complete search history.

(56) References Cited

U.S. PATENT DOCUMENTS

| 6,278,236 | B1 |   | 8/2001  | Madathil et al. |         |
|-----------|----|---|---------|-----------------|---------|
| 6,395,409 | B1 |   | 5/2002  | Ueda et al.     |         |
| 6,455,579 | B1 |   | 9/2002  | Satsuki et al.  |         |
| 6,534,202 | B1 | * | 3/2003  | Sato et al.     | 428/690 |
| 6,589,673 | B1 | * | 7/2003  | Kido et al.     | 428/690 |
| 6,614,176 | B1 | * | 9/2003  | Kim et al.      | 313/506 |
| 6,633,124 | B1 | * | 10/2003 | Himeshima et al.| 313/506 |
| 6,809,473 | B1 | * | 10/2004 | Ueda et al.     | 313/504 |
| 6,811,896 | B1 | * | 11/2004 | Aziz et al.     | 428/690 |
| 6,902,834 | B1 | * | 6/2005  | Lee et al.      | 428/690 |

FOREIGN PATENT DOCUMENTS

| JP | A 10-74586   | 3/1998  |
|----|--------------|---------|
| JP | A-11-111461  | 4/1999  |
| JP | A 11-191490  | 7/1999  |
| JP | A 2000-113976| 4/2000  |
| JP | A 2003-142274| 5/2003  |
| JP | A 2003-264088| 9/2003  |
| KR | 2000-0067671 | 11/2000 |
| KR | 2001-0024993 | 3/2001  |

* cited by examiner

*Primary Examiner*—Hung Xuan Dang
*Assistant Examiner*—Tuyen Tra
(74) *Attorney, Agent, or Firm*—Oliff & Berridge, plc

(57) ABSTRACT

To provide an electro-optic device whose luminescent characteristic are enhanced for each type of RGB organic EL layers by forming an electron injection layer and a cathode uniformly with respect to a substrate, and to provide a method to manufacture the electro-optic device and an electronic apparatus using the electro-optic device, an electro-optic device includes plural types of luminescent layers emitting different luminescent colors of light and an electron injection layer between electrodes and opposing each other. The electron injection layer is formed of a plurality of metal compounds.

20 Claims, 14 Drawing Sheets

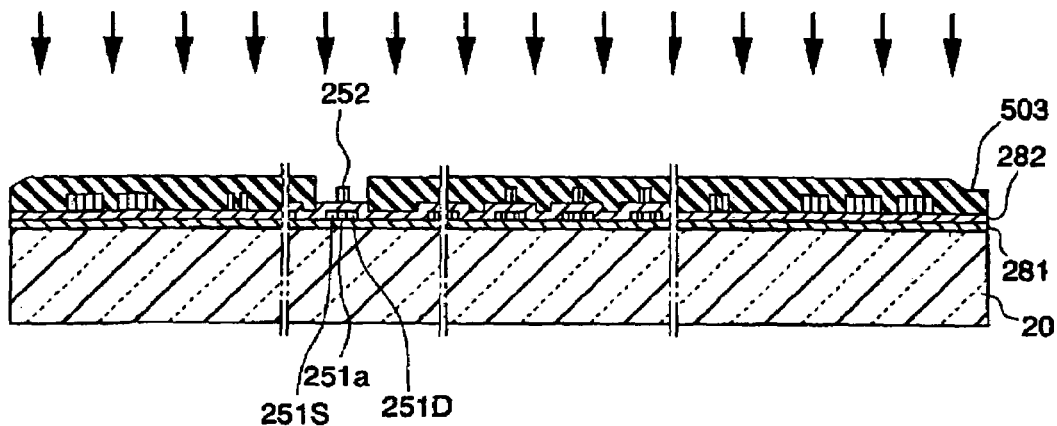
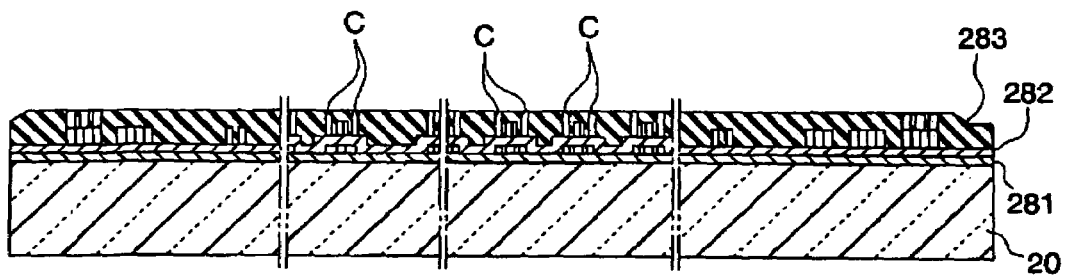
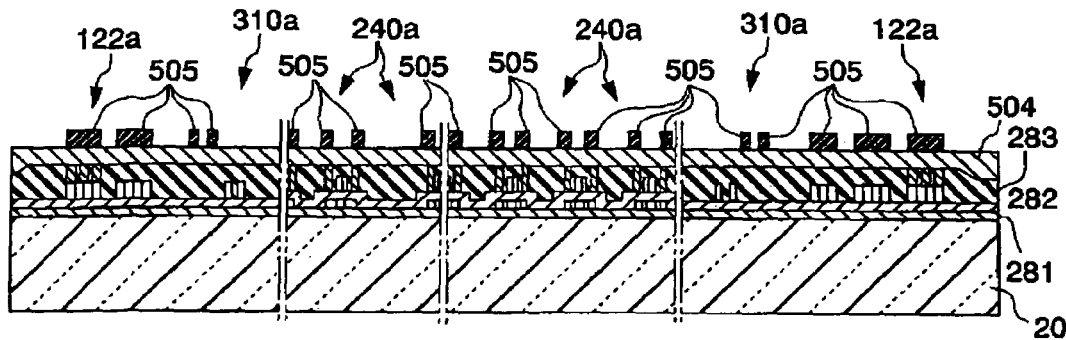

FIG.12

ALKALI METALS (MONOVALENT)

| Elements | W.F. (eV) | First ionization energy | m.p.(°C) | b.p.(°C) | Metallic bond radius Å |
|---|---|---|---|---|---|
| Li | 2.9 | 5.39 | 180 | 1347 | 1.52 |
| Na | 2.75 | 5.13 | 97 | 882.9 | 1.86 |
| K | 2.3 | 4.33 | 63 | 774 | 2.27 |
| Rb | 2.16 | 4.17 | 38.9 | 688 | 1.52 |
| Cs | 2.14 | 3.89 | 28.4 | 678 | 2.65 |

ALKALINE EARTH METALS (DIVALENT)

| Elements | W.F. (eV) | First ionization energy | m.p.(°C) | b.p.(°C) | Metallic bond radius Å |
|---|---|---|---|---|---|
| Mg | 3.66 | 7.64 | 648 | 1090 | 1.6 |
| Ca | 2.87 | 6.11 | 839 | 1480 | 1.97 |
| Sr | 2.59 | 5.62 | 769 | 1384 | 2.15 |
| Ba | 2.7 | 5.21 | 725 | 1640 | 2.22 |

RARE EARTH METALS (TRIVALENT)

| Elements | W.F. (eV) | First ionization energy | m.p.(°C) | b.p.(°C) | Metallic bond radius Å |
|---|---|---|---|---|---|
| Y | 3.1 | | 1523 | 3338 | |
| La | 3.5 | | 920 | 3457 | |
| Ce | 2.9 | | 798 | 3426 | |
| Sm | 2.7 | 5.64 | 1072 | 1791 | 1.8 |
| Eu | 2.5 | | 822 | 1597 | |
| Gd | 3.1 | | 1311 | 3266 | |
| Tb | 3 | | 1360 | 3123 | |
| Er | 3.2 | | 1522 | 2863 | |
| Yb | 2.6* | 6.22 | 824 | 1193 | 1.94 |

FIG.13

|  | Element | Atomic radius (Å) | Work function (eV) | Density |
|---|---|---|---|---|
|  | Al | 1.43 | 4.28 | 2.69 |
|  | Ag | 1.44 | 4.26 | 10.49 |
| Rare earth metal | Yb | 1.94 | 2.6 | 6.9 |
|  | Sm | 1.8 | 2.7 | 7.53 |
| Alkali metal | Li | 1.52 | 2.9 | 0.53 |
|  | Na | 1.86 | 2.75 | 0.971 |
|  | K | 2.27 | 2.3 | 0.862 |
|  | Rb | 1.52 | 2.16 | 1.53 |
|  | Cs | 2.65 | 2.14 | 1.87 |
| Alkaline earth metal | Mg | 1.6 | 3.66 | 1.73 |
|  | Ca | 1.97 | 2.87 | 1.55 |
|  | Sr | 2.15 | 2.59 | 2.63 |
|  | Ba | 2.22 | 2.7 | 3.62 |

FIG.14

| FLUORIDES | m.p. °C |
|---|---|
| LiF | 870 |
| NaF | 988 |
| KF | 858 |
| RbF | 775 |
| CsF | 682 |
| MgF2 | 1200 |
| CaF2 | 1360 |
| SrF2 | 1190 |
| BaF2 | 1280 |

| OXIDES | m.p. °C |
|---|---|
| Li2O | 1427 |
| Na2O |  |
| K2O |  |
| Rb2O |  |
| Cs2O |  |
| MgO | 2800 |
| CaO | 2570 |
| SrO | 2430 |
| BaO | 1920 |

| CHLORIDES | m.p. °C |
|---|---|
| LiCl |  |
| NaCl | 800 |
| KCl |  |
| RbCl | 718 |
| CsCl | 645 |
| MgCl2 |  |
| CaCl2 |  |
| SrCl2 |  |
| BaCl2 | 963 |

ELECTRO-OPTIC DEVICE, METHOD FOR MANUFACTURING THE SAME, AND ELECTRONIC APPARATUS

BACKGROUND OF THE INVENTION

1. Field of Invention

The present invention relates to electro-optic devices, methods to manufacture the same, and electronic apparatus.

2. Description of Related Art

Electro-optic devices having luminescent layers include an organic EL display device having organic electro luminescence (hereinafter "organic EL") elements. In a typical organic EL element, a functional organic layer including an organic EL layer (luminescent layer) lies between a pair of opposing electrodes.

An organic EL display device for color images includes a plurality types of organic EL layers, each having a luminescence spectrum band corresponding to red (R), green (G), or blue (B). The organic EL layers for these colors are arranged in a predetermined manner on a substrate.

In order to enhance the luminescence characteristics of the organic EL display device, such as luminance and luminous efficacy, an electron injection layer is provided to accelerate electron injection from a cathode to the organic EL layers. The electron injection layer is generally formed by vapor depositing of, for example, a metal fluoride. (See, Japanese Unexamined Patent Application Publication No. 11-191490, Japanese Unexamined Patent Application Publication No. 10-74586, and Japanese Unexamined Patent Application Publication No. 2000-113976.

SUMMARY OF THE INVENTION

An electron injection layer disposed in an identical manner for each organic EL layer, however, provides superior luminescence characteristics to one type of organic EL layers, but inferior luminescence characteristics to other types. For example, a LiF electron injection layer uniformly disposed for red (R), green (G), and blue (B) organic EL layers provides desired luminescence characteristics to the blue (B) organic EL layers. In contrast, a uniformly disposed electron injection layer of a metal compound, other than LiF, may provide desired luminescence characteristics to organic EL layers other than the B organic EL layers. It has therefore been required that different types of electron injection layers are disposed according to the types of the organic EL layers to produce desired color images.

Mask deposition is applied to dispose each electron injection layer in only a desired position. Unfortunately, this process requires not only a mask to define deposition areas, but also highly precise alignment of the mask with the substrate. Furthermore, it is difficult to align a mask with a substrate having a large number of deposition areas.

The cathode, which is in contact with an electron injection layer, is generally formed by vapor deposition. The cathode is preferably uniformly provided so that the organic EL display device displays well-balanced RGB color images. Accordingly, the electron injection layer needs to be formed uniformly over the entire surfaces of the organic EL layers without applying mask deposition.

In view of the above-described circumstances, the present invention provides an electro-optic device whose luminescence characteristics are enhanced for each type of RGB organic EL layers by forming an electron injection layer and a cathode uniformly with respect to a substrate, and to provide a method to manufacture the electro-optic device and an electronic apparatus using the electro-optic device.

In order to accomplish the above, the following are applied to the present invention.

Specifically, an electro-optic device is provided which includes plural types of luminescent layers emitting different colors of light and an electron injection layer between electrodes opposing each other. The electron injection layer includes a plurality of metal compounds.

The opposing electrodes refer to an anode and a cathode. The luminescent layers allow holes from the anode and electrons from the cathode to recombine to be deactivated from their excited state, thereby emitting light. The different colors of light refer to luminescent colors of red (R), green (G), and blue (B).

The electron injection layer efficiently injects and transports electrons from the cathode to the luminescent layers, thus functioning as an electron transport layer.

The metal compounds enhance the luminescence characteristics of at least one type of the luminescent layers and are selected according to desire so as to provide a superior electron injection layer. The metal compounds may enhance the luminescence characteristics of each type of the luminescent layers.

Thus, the electron injection layer, in an aspect of the present invention, is formed of the plurality of metal compounds between the luminescent layers and the cathode. Consequently, the electron injection layer efficiently injects electrons into each of the R, G, and B luminescent layers. This structure of an aspect of the present invention addresses the problem of providing superior luminescence characteristics to one type of organic EL layers but inferior luminescence characteristics to other types, in comparison with the structure in which a single metal material is deposited in an identical manner over plural types of luminescent layers. Thus, it is no longer necessary to provide a specific electron injection layer for each type of the luminescent layers.

In the electro-optic device including this electron injection layer, when current flows between the anode and the cathode, holes in the anode are injected into the luminescent layers and electrons in the cathode are injected into the luminescent layers. The holes and the electrons are combined in the luminescent layers to emit light. Thus, superior luminescence characteristics are produced to display full color images with suitable gradation.

The plurality of metal compounds may principally contain at least one metal selected from the group including alkali metals, alkaline earth metals, and rare earth metals.

Thus, the electron injection layer efficiently injects electrons into the luminescent layers because of these metal compounds.

The above-described metal compounds may be of fluoride, oxide, or chloride.

The phrase "principally contain" herein refers to containing as the principal constituent that has the highest content.

The plurality of metal compounds may be mixed. States of the mixed metal compounds include a state where the molecules or atoms of the metal compounds are present together in a very small thickness, that is, in a substantially two-dimensional ultra-thin film. The states also include a state where molecules or atoms coexist closely in such a manner that some molecules or atoms form a mesh-like ultra-thin film with voids in substantially two dimensions and that the other molecules or atoms fill the voids.

Thus, the electron injection layer, in an aspect of the present invention, contains the plurality of metal compounds in a mixture form so that each of the metal compounds is involved in all the luminescent layers. Consequently, the electron injection layer efficiently injects electrons into each of the R, G, and B luminescent layers.

The plurality of metal compounds may be deposited on top of one another.

Thus, the electron injection layer, in an aspect of the present invention, is formed by depositing the plurality of metal compounds on top of one another. Consequently, the electron injection layer efficiently injects electrons into each of the R, G, and B luminescent layers.

The order to deposit the plurality of metal compounds may be specified according to the chemical bonding forces of the metal compounds.

The chemical bonding force herein refers to a bonding force between the metal elements and, for example, a halogen element, such as fluorine (F) or chlorine (Cl), or oxygen (O) of the metal compounds.

Consequently, the resulting electro-optic device produces the same effects as above. In the electron injection layer of this electro-optic device, the metal compounds are deposited between the luminescent layers and the cathode in order specified according to the chemical bonding forces. The electron injection layer, therefore, efficiently injects and transports electrons into the luminescent layers due to the difference between the chemical bonding forces, thus producing superior luminescence characteristics.

The order to deposit the plurality of metal compounds may be specified according to the valences of the metal elements of the metal compounds.

Consequently, the resulting electro-optic device produces the same effects as above. In the electron injection layer of this electro optic device, the metal compounds are deposited between the luminescent layers and the cathode in an order specified according to the valences of the metal elements. The electron injection layer, therefore, efficiently injects and transports electrons into the luminescent layers due to the difference between the valences of the metal elements, thus producing superior luminescence characteristics.

The order to deposit the plurality of metal compounds may be specified according to the ionic radiuses of the metal ions of the metal compounds.

Consequently, the resulting electro-optic device produces the same effects as above. In the electron injection layer of this electro optic device, the metal compounds are deposited between the luminescent layers and the cathode in order specified according to the ionic radiuses of the metal ions. The electron injection layer, therefore, efficiently injects and transports electrons into the luminescent layers due to the difference between the ionic radiuses of the metal ions, thus producing superior luminescence characteristics.

The order to deposit the plurality of metal compounds may be specified according to the work functions of the metal elements of the metal compounds.

Consequently, the resulting electro-optic device produces the same effects as above. In the electron injection layer of this electro optic device, the metal compounds are deposited between the luminescent layers and the cathode in an order specified according to the work functions of the metal elements. The electron injection layer, therefore, efficiently injects and transports electrons into the luminescent layers due to the difference between the work functions of the metal elements, thus producing superior luminescence characteristics.

One of the opposing electrodes is in contact with the electron injection layer, and may contain a metal reducing the metal compounds.

Some of the alkali metals, alkaline earth metals, and rare earth metals have saturated vapor pressures higher than those of high-melting-point metals, such as Al. In general, compounds of these metals are reduced by Al being a high-melting-point metal. For example, calcium oxide (CaO) is reduced by Al to liberate Ca. Rubidium oxide ($Rb_2O$) and strontium oxide (SrO) are also reduced by Al to liberate Rb and Sr.

Thus, the metal compounds are reduced to liberate the metal atoms of the metal compounds and, thus, the luminescent layers are doped with the metal atoms. The metal atoms diffuse into the luminescent layers to merge with the macromolecules in the luminescent layers. Thus, the electron injection layer and the luminescent layers intertwine with each other, thereby enhancing the electron injection characteristics. Hence, the luminescence characteristics of the luminescent layers are enhanced.

Preferably, metals reducing the metal compounds include Al, Au (gold), Ag (silver), Cr (chromium), Cu (copper), Ni (nickel), Ca, Mg (magnesium), Sr, Yb (ytterbium), Er (erbium), Tb (terbium), and Sm (samarium).

A method to manufacture an electro-optic device including plural types of luminescent layers emitting different colors of light, an electron injection layer, and a cathode includes forming the electron injection layer of a plurality of metal compounds.

The method provides the foregoing electro-optic device, thus providing the same effects as in the foregoing electro-optic device.

In the method to manufacture the electro-optic device, the plurality of metal compounds may be mixed to form the electron injection layer.

The method provides the foregoing electro-optic device, thus providing the same effects as in the foregoing electro-optic device.

To deposit the metal compounds in a mixture form, vapor codeposition is preferably applied. In vapor codeposition, a plurality of metal compounds are vaporized in the same vacuum vessel to deposit a thin-film containing the metal compounds mixed over the substrate. Thus, by applying vapor codeposition, the plurality of metal compounds are suitably mixed and result in an electron injection layer.

In the method to manufacture the electro-optic device, the plurality of metal compounds may be deposited on top of one another to form the electron injection layer.

The method provides the foregoing electro-optic device, thus providing the same effects as in the foregoing electro-optic device.

To deposit the metal compounds in a layered form, vapor deposition is preferably applied. In vapor deposition, metals are each vaporized in a vacuum vessel at a predetermined temperature and pressure to deposit the metal atoms and metal molecules to a small thickness on a predetermined substrate. Vapor deposition facilitates the formation of a uniform thin film with a thickness on the order of nanometers. Thus, by applying vapor deposition, the plurality of metal compounds are deposited on top of one another and result in an electron injection layer.

In the method to manufacture the electro-optic device, the plurality of metal compounds may be deposited in order specified according to the chemical bonding forces thereof, to form the electron injection layer.

Consequently, the resulting electro-optic device produces the same effects as above. In the electron injection layer of this electro-optic device, the metal compounds are deposited between the luminescent layers and the cathode in an order specified according to the chemical bonding forces.

In the method to manufacture the electro-optic device, the plurality of metal compounds may be deposited in an order specified according to the chemical bonding forces thereof to form the electron injection layer. Consequently, the resulting electro-optic device produces the same effects as above. In the electron injection layer of this electro optic device, the metal compounds are deposited between the luminescent layers and the cathode in order specified according to the valences of the metal elements.

In the method to manufacture the electro-optic device, the plurality of metal compounds may be deposited in order specified according to the ionic radiuses of the metal ions thereof to form the electron injection layer.

Consequently, the resulting electro-optic device produces the same effects as above. In the electron injection layer of this electro optic device, the metal compounds are deposited between the luminescent layers and the cathode in an order specified according to the ionic radiuses of the metal ions.

In the method to manufacture the electro-optic device, the plurality of metal compounds may be deposited in order specified according to the work functions of the metal elements thereof to form the electron injection layer.

Consequently, the resulting electro-optic device produces the same effects as above. In the electron injection layer of this electro-optic device, the metal compounds are deposited between the luminescent layers and the cathode in an order specified according to the work functions of the metal elements.

The method to manufacture the electro-optic device may further includes forming the cathode of a metal reducing the metal compounds.

The method provides the foregoing electro-optic device, thus providing the same effects as in the foregoing electro-optic device.

An aspect of the present invention also directed to an electronic apparatus including the electro-optic device of an aspect of the present invention.

The electronic apparatus may be a cellular phone, a mobile information terminal, a wristwatch, or an information processing apparatus, such as a word processor or a personal computer. By using the electro-optic device of an aspect of the present invention as the display, the resulting electronic apparatus exhibits superior luminescence characteristic.

BRIEF DESCRIPTION OF THE DRAWINGS

FIGS. 7(E)–7(G) are a process representation of the EL display device according to the first exemplary embodiment;

FIG. 12 is a representation of properties of metal compounds constituting an electron injection layer 52;

FIG. 13 is a representation of properties of metal compounds constituting the electron injection layer 52;

FIG. 14 is a representation of melting points of metal compounds constituting the electron injection layer 52.

DETAILED DESCRIPTION OF PREFERRED EMBODIMENTS

Exemplary embodiments of the electro-optic device, methods to manufacture the same, and electronic apparatus using the aspects the present invention will now be illustrated with reference to figures. While the invention will be described using the exemplary embodiments, various modification in form and detail may be made without departing from the scope and spirit of the invention. The layers and members in the figures are illustrated on different scales so as to be visible.

First Exemplary Embodiment

Figure 1:
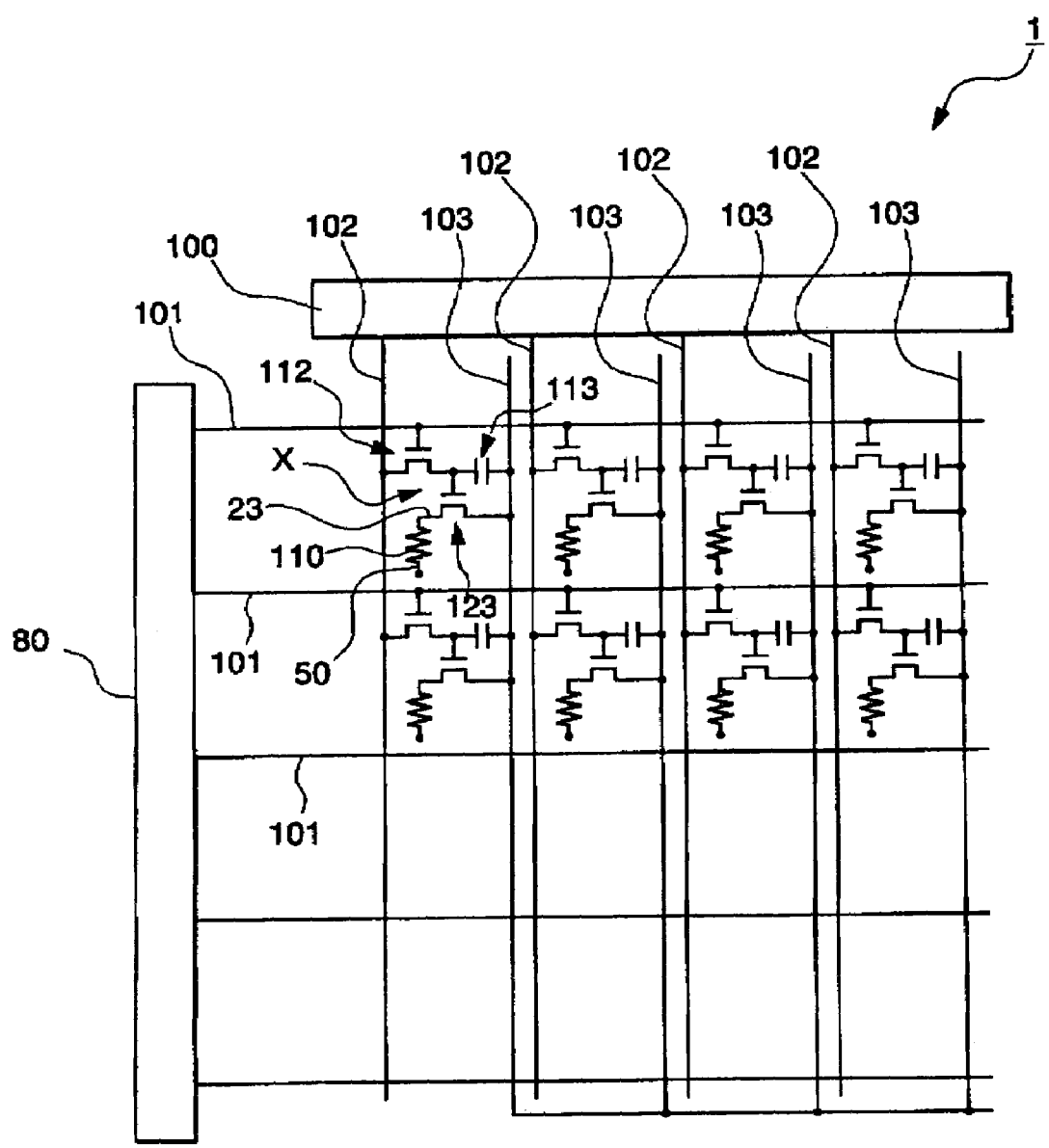
FIG. 1 is a schematic of a wiring arrangement of an EL display device according to the first exemplary embodiment.

For a first exemplary embodiment of the electro-optic device of the present invention, an EL display device using electroluminescence substances, particularly organic EL materials, will be described. FIG. 1 is a schematic illustration of a wiring arrangement of the EL display device according to the first exemplary embodiment.

EL Display Device

The EL display device (electro-optic device) 1 shown in FIG. 1 is an active matrix EL display device using thin-film transistors (hereinafter "TFTs") as switching elements.

The EL display device 1 includes a plurality of scanning lines 101, a plurality of signal lines 102 extending perpendicular to the scanning lines 101, a plurality of power lines 103 extending parallel to the signal lines 102, and pixel regions X at the vicinities of the intersections of the scanning lines 101 and the signal lines 102, as shown in FIG. 1.

The signal lines 102 are each connected to a data line driving circuit 100 including a shift register, a level shifter, a video line, and an analog switch. The scanning lines 101 are each connected to a scanning line driving circuit 80 including a shift register and a level shifter.

Each pixel region X includes: a switching TFT 112 having a gate electrode to which scanning signals are transmitted through the corresponding scanning line 101; a hold capacitor 113 to hold an image signal supplied from the corresponding signal line 102 through the switching TFT 112; a driving TFT 123 having a gate electrode to which the image signal held by the hold capacitor 113 is transmitted; a pixel electrode 23 to which a driving current is transmitted from the corresponding power line 103 when the pixel electrode 23 is electrically connected to the power line 103 with the driving TFT 123; and a function layer 110 between the pixel electrode 23 and a cathode 50. The pixel electrode 23, the cathode 50, and the function layer 110 constitute a luminescent element.

In the EL display device 1, when the scanning line 101 is activated to turn on the switching TFT 112, the potential of the signal line 102 at this moment is held by the hold capacitor 113 and an on-off state of the driving TFT 123 is set depending on the state of the hold capacitor 113. Current from the power line 103 is transmitted to the pixel electrode 23 through the channel of the driving TFT 123 and further transmitted to the cathode 50 through the function layer 110. The function layer 110 emits light according to the quantity of incoming current.

Figure 2:
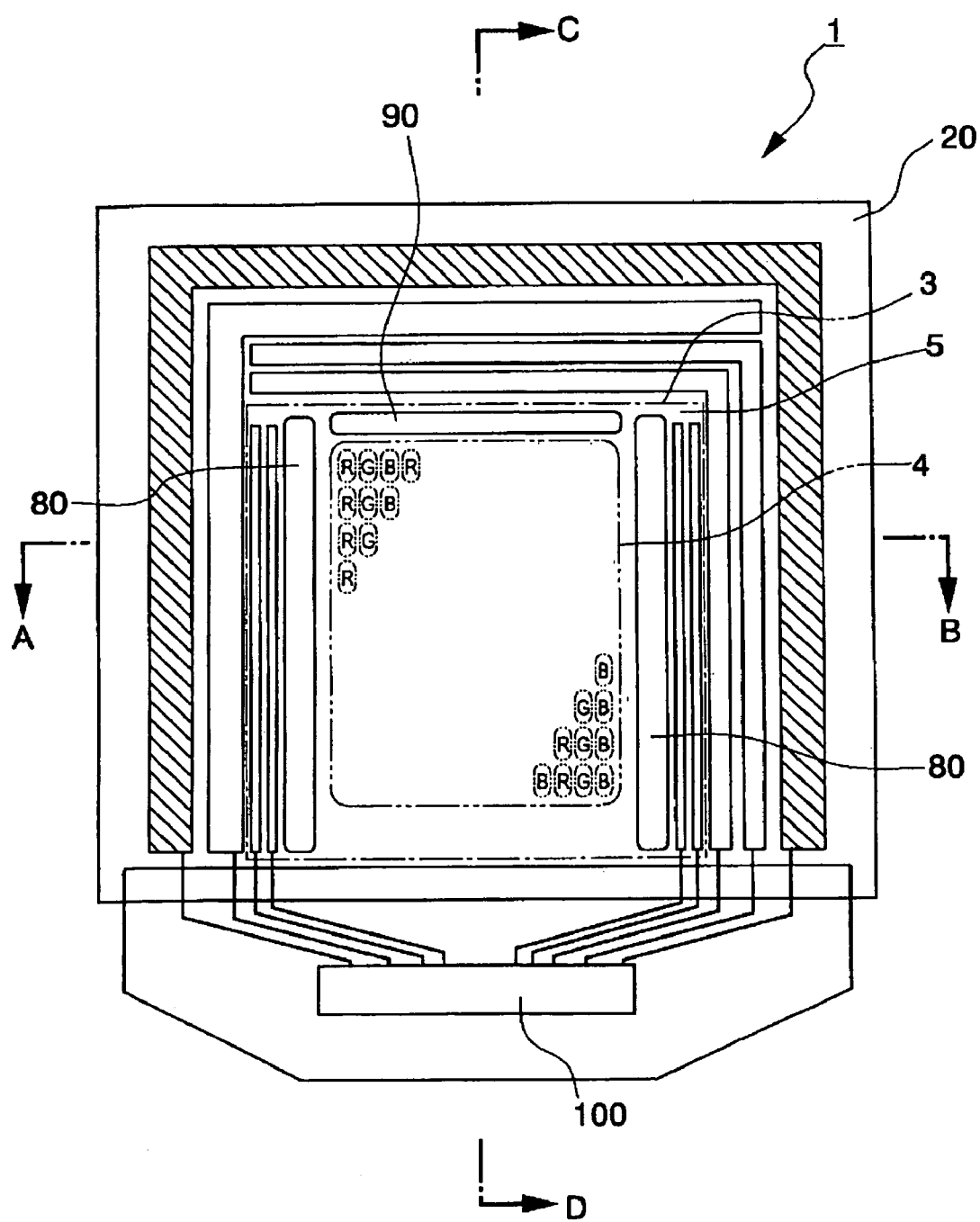
FIG. 2 is a schematic of the EL display device according to the first exemplary embodiment.
Figure 3:
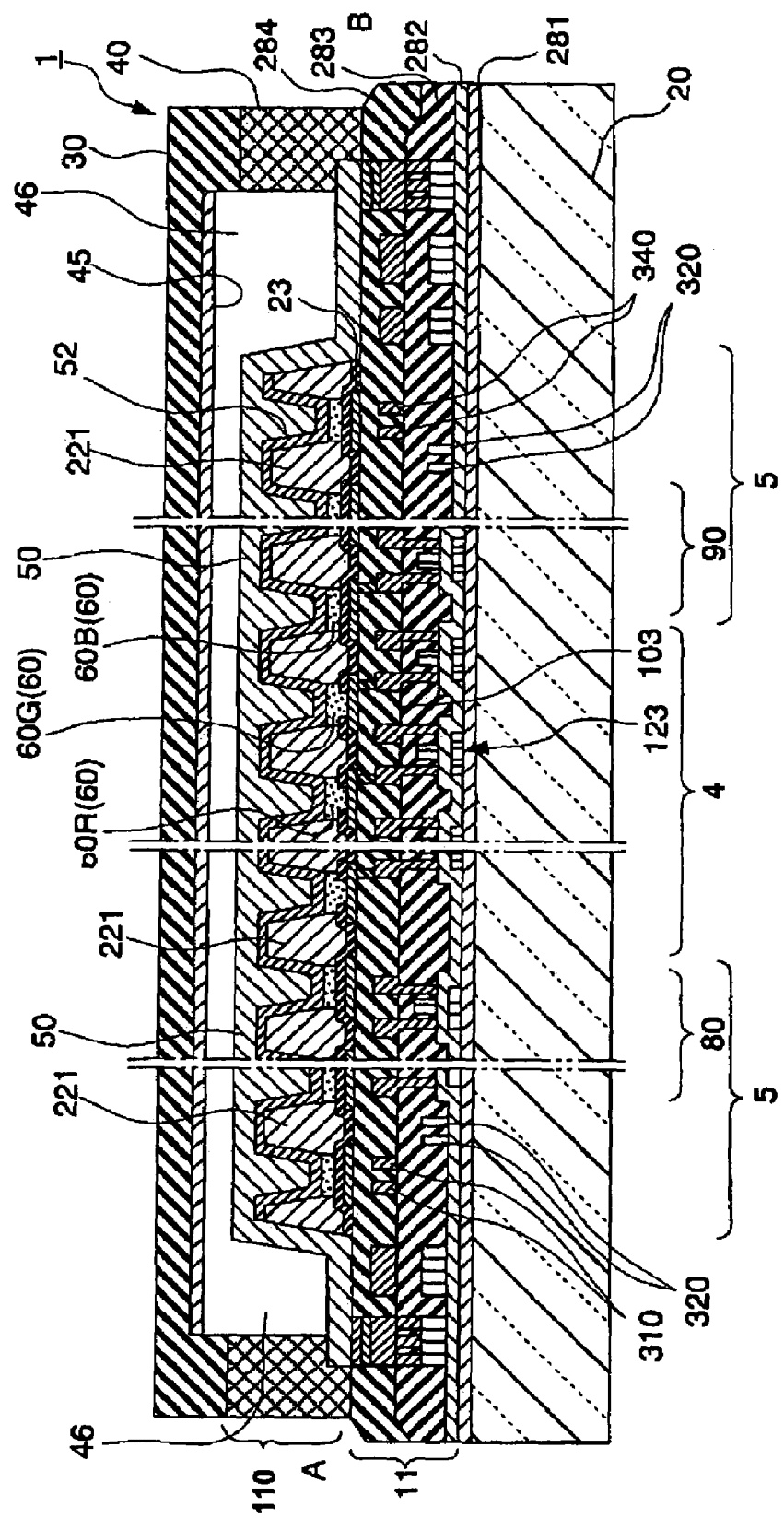
FIG. 3 is a sectional view taken along plane A-B in FIG. 2.
Figure 4:
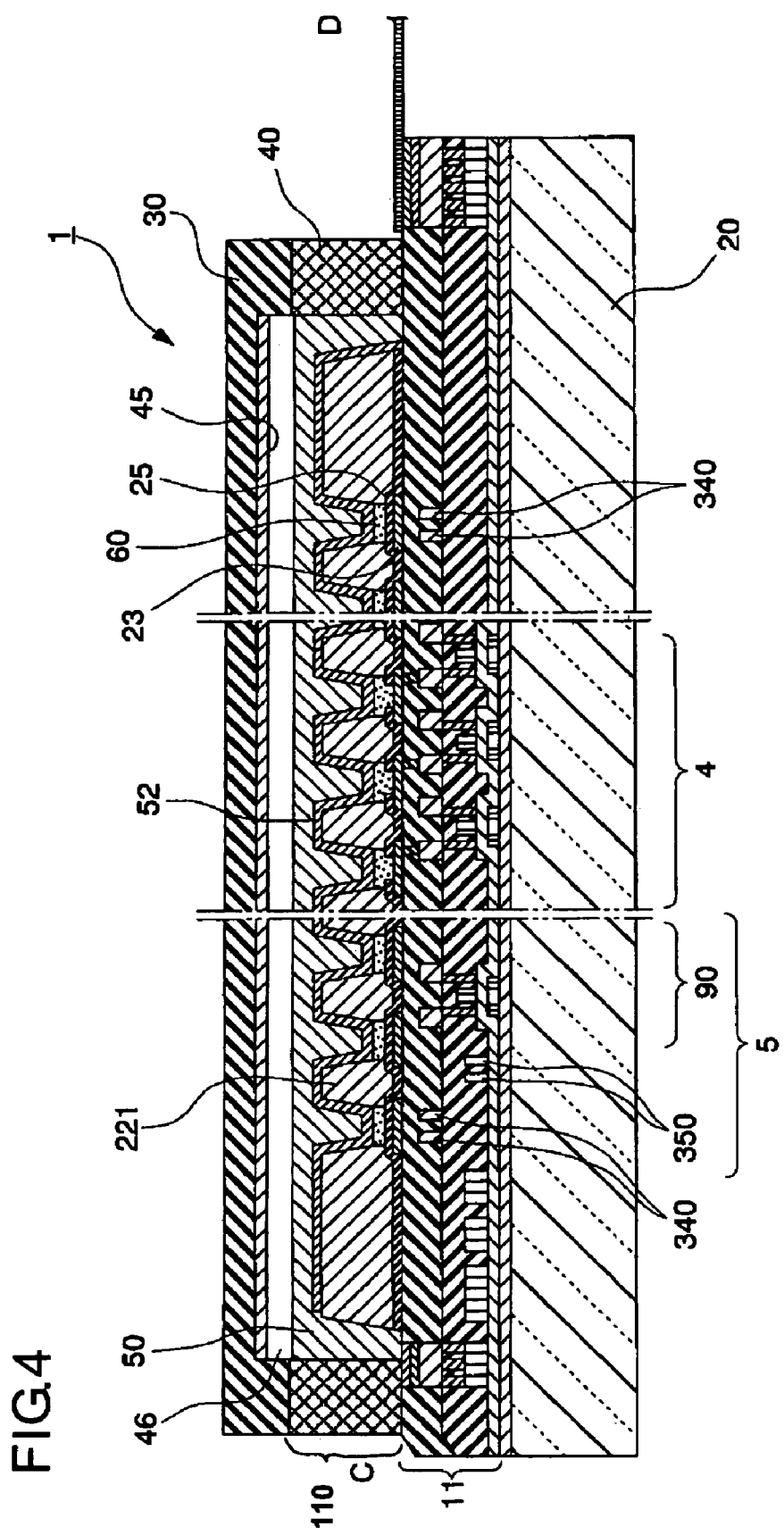
FIG. 4 is a sectional view taken along plane C-D in FIG. 2.
Figure 5:
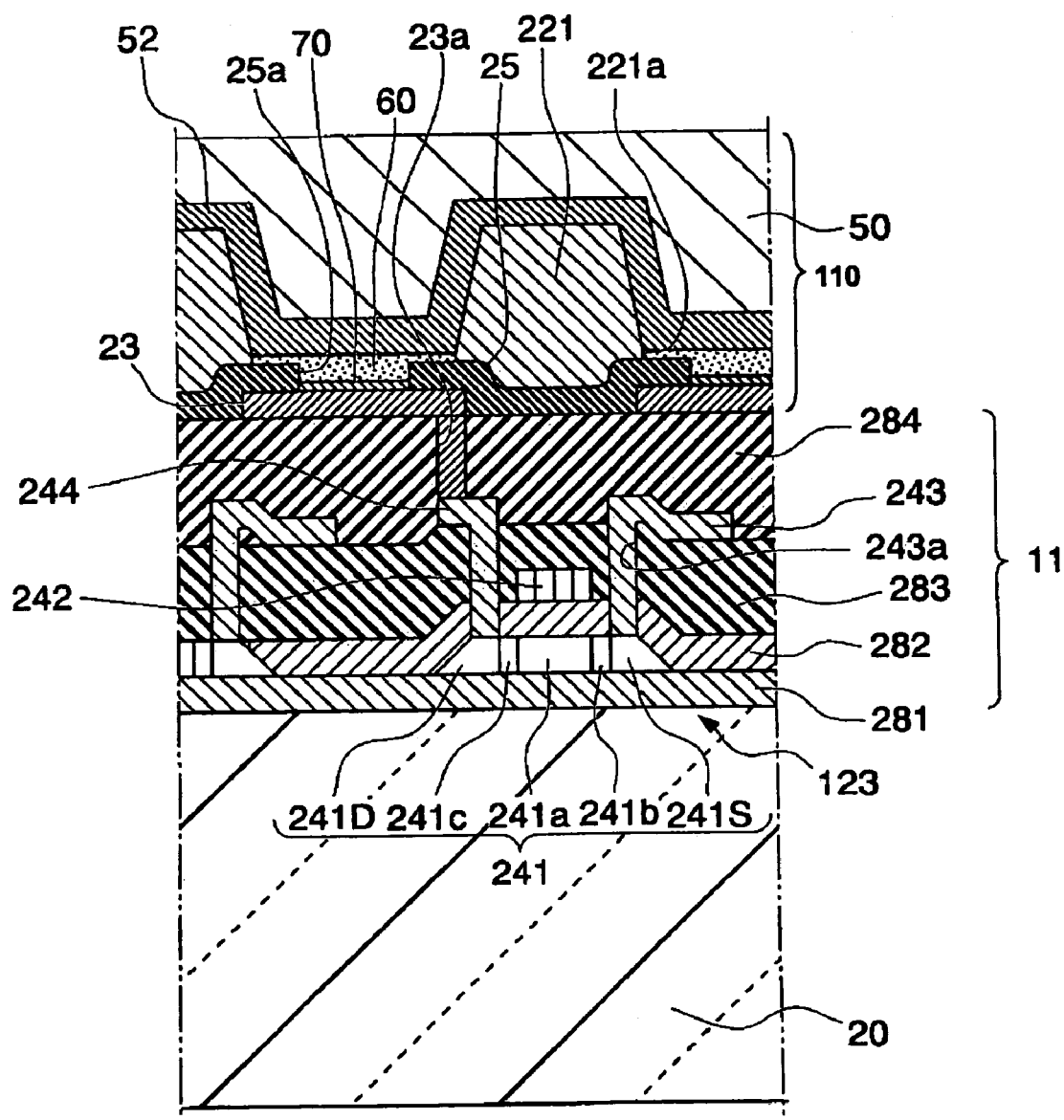
FIG. 5 is a fragmentary enlarged sectional view of the principal portion shown in FIG. 3.

The form of the EL display device of the present exemplary embodiment will be illustrated in detail with reference to FIGS. 2 to 5. FIG. 2 is a schematic plan view showing the constitution of the EL display device 1. FIG. 3 is a sectional view taken along plane A-B in FIG. 2, and FIG. 4 is a sectional view taken along plane C-D in FIG. 2. FIG. 5 is a fragmentary enlarged sectional view of the principal portion shown in FIG. 3.

The EL display device 1 of the present exemplary embodiment, shown in FIG. 2, includes: a light-transmissive, electrically insulative substrate 20; a pixel electrode region, not shown in the figure, in which pixel electrodes are each connected to the corresponding switching TFT, not shown in the figure, and are arranged in a matrix manner on the substrate 20; the power lines 103 disposed around the pixel electrode region, are each connected to a corresponding pixel electrode; and a pixel portion 3 (inside the area designated by the dotted-chain line in the figure) being substantially rectangular in plan view, is disposed over at least the pixel electrode region. The pixel portion 3 is divided into two regions: an effective display region 4 (inside the area designated by the two-dot chain line in the figure) in the middle of the pixel portion; and a dummy region 5 (in the area between the dotted-chain line and the two-dot chain line) in the peripheral region of the effective display region 4.

The effective display region 4 includes R, G, and B display regions each having the pixel electrode, arranged separately in the A-B direction and the C-D direction.

The scanning line driving circuits 80, 80 are disposed at both sides in the figure of the effective display region 4. The scanning line driving circuits 80, 80 are positioned under the dummy region 5.

In addition, a test circuit 90 is provided above the effective display region 4 in the plan view. The test circuit 90 is positioned under the dummy region 5. The test circuit 90 is intended to check the operational state of the EL display device 1. For example, the test circuit 90 includes a check data output device, not shown in the figure, to output a check record, so that the quality and defect of the display device during the manufacturing process or before shipping can be checked for defects.

The driving voltages of the scanning line driving circuits 80 and the test circuit 90 are applied from a predetermined power supply through driving voltage conductors 310 (see FIG. 3) and other driving voltage conductors 340 (see FIG. 4). Drive control signals and driving voltages to the scanning line driving circuits 80 and the test circuit 90 are transmitted and applied from a predetermined main driver or the like to control the operation of the EL display device 1 through drive control signal conductors 320 (see FIG. 3) and a driving voltage conductor 350 (see FIG. 4). The drive control signals refer to control command signals transmitted from the main driver or the like when the scanning line driving circuits 80 and the test circuit 90 output signals.

As shown in FIGS. 3 and 4, the EL display device 1 has the substrate 20 and a sealing substrate 30 bonded with a sealing resin 40. In the region enclosed by the substrate 20, the sealing substrate 30, and the sealing resin 40, a dryer 45 and a nitrogen gas-filling layer 46, which is filled with nitrogen gas, are provided to reduce or prevent water and oxygen from entering the inside of the EL display device 1.

Thus, the lifetime of the EL display device 1 is increased. The dryer 45 may be replaced with a getter.

For a so-called top-emission EL display device, the substrate 20 may be transparent or opaque because luminescent light is picked up from the sealing substrate 30 opposing the substrate 20. Exemplary opaque materials for the substrate 20 include ceramics, such as alumina, metal sheets, such as stainless steel sheets, insulated by surface oxidation, thermosetting resins, and thermoplastic resins.

For a so-called back-emission EL display device, the substrate 20 is transparent or semitransparent because luminescent light is picked up from the substrate 20. For example, glass, quartz, and resins (plastics and plastic films) are used, and particularly soda glass is preferably used because of its low expense.

The sealing substrate 30 may be of an electrically insulative plate. The sealing resin 40 includes a thermosetting resin or a UV curable resin. In particular, an epoxy resin, which is one type of thermosetting resins, is preferably used.

A circuit portion 11 including the driving TFTs 123 and other elements for driving the pixel electrodes 23 is formed over the substrate 20 and the function layer 110 is provided on the circuit portion 11. As shown in FIG. 5, the function layer 110 includes pixel electrodes 23, hole injection/transport layers 70 to inject and transport holes from the respective pixel electrodes 23, organic EL layers (luminescent layers) 60 including an organic EL substance, which is one type of electro-optic substances, an electron injection layer 52 to inject electrons into the organic EL layers 60, and a cathode 50, deposited in that order.

The pixel electrodes 23, which are formed of a transparent conducive film, such as ITO, inject positive holes to the respective organic EL layers 60 with an applied voltage, and have a high work function and conductivity. The material of the pixel electrodes 23 is not limited to ITO. For a so-called top emission EL display device, it is not necessary to use a light-transmissive material and any suitable material may be used. For a so-called back emission EL display device, suitable transparent materials may be used. For example, metal oxides may be used, including indium tin oxide (ITO) and zinc (Zn)-containing metal oxides, such as indium zinc oxide amorphous transparent conductive film (IZO, registered trademark, produced by Idemitsu Kosan Co., Ltd.).

The hole injection/transport layers 70 are formed of, for example, a polythiophene derivative or a polypyrrole derivative, which may be doped with a substance. More specifically, for example, Bytron-p produced by Bayer Chemicals, which is one type of PEDOT:PSS (polyethylenedioxythiophene doped with polystyrene sulfonate), is preferably used.

The organic EL layers 60 each have a luminescence spectrum band corresponding to one of three primary colors to display full color images. A pixel is constituted of an organic EL layer 60R having a red luminescence spectrum band, an organic EL layer 60G having a green luminescence spectrum band, and an organic EL layer 60B having a blue luminescence spectrum band. Light from these organic EL layers is gradated and emitted. Thus, the EL display device 1 produces full color images as a whole.

The organic EL layers 60 may be formed of suitable luminescent materials capable of emitting fluorescence or phosphorescence. The luminescent materials may include polyfluorene derivatives (PF), poly(p-phenylene vinylene) derivatives (PPV), polyphenylene derivatives (PP), poly(p-phenylene) derivatives (PPP), polyvinylcarbazole (PVK), polythiophene derivatives, and polysilanes such as poly (methylphenylsilane) (PMPS).

These materials may be doped with colorants, such as perylene derivatives, coumarin derivatives, and rhodamine derivatives. Exemplary dopants include rubrene, perylene, 9,10-diphenylanthracene, tetraphenylbutadiene, Nile Red, Coumarin 6, quinacridone.

The electron injection layer 52 contains a plurality of metal compounds, and is uniformly provided over the entire surfaces of the organic EL layers 60. One of the metal compounds enhances the luminescence characteristics of at least one of the organic EL layers 60, and another of the metal compounds enhances the luminescence characteristics of the other organic EL layers 60. The plurality of metal compounds inject electrons without degrading the luminescence characteristics of any of the organic EL layers 60R, 60G, and 60B.

The electron injection layer 52 is formed by vapor codeposition so as to contain the plurality of metal compounds, as described later. Thus, several types of molecules or atoms are allowed to be present together and have a very small thickness in the electron injection layer 52. In another case, the molecules or atoms of the metal compounds coexist closely in such a manner that some of the molecules or atoms form a mesh-like ultra-thin film that is substantially two dimensional with voids filled with the other molecules or atoms.

Each of the plurality of metal compounds is, therefore, involved in all the organic EL layers 60, and more specifically the metal compounds are in contact with the organic EL layers 60R, 60G, and 60B in terms of electron injection.

The metal compounds may be of low work function, and principally contain at least one of alkali metals, alkaline earth metals, and rare earth metals. Metal compounds may include fluorides, oxides, and chlorides of these metals, such as NaF (sodium fluoride), LiF (lithium fluoride), CsF (cesium fluoride), RbF (rubidium fluoride), $Na_2O$ (sodium oxide), $Li_2O$ (lithium oxide), $CaF_2$ (calcium fluoride), $MgF_2$ (magnesium fluoride), $BaF_2$ (barium fluoride), $SrF_2$ (strontium fluoride), $YbF_3$ (ytterbium fluoride), $ErF_3$ (erbium fluoride), $TbF_3$ (terbium fluoride), and $SmF_3$ (samarium fluoride).

In the present exemplary embodiment, LiF and $SrF_2$ are used as the metal compounds.

The cathode 50 has an area larger than that of the total area of the effective display region 4 and dummy region 5 to cover both of them, as shown in FIGS. 3 and 4, and contains a metal that reduces the metal compounds of the electron injection layer 52. The cathode 50 may be a composite including a first cathode layer of a reducing metal deposited at the organic EL layer 60 side and a second cathode layer of aluminum, an alloy principally containing aluminum, silver, or a silver-magnesium alloy deposited on the first cathode layer.

Reducing metals may include Al, Au (gold), Ag (silver), Cr (chromium), Cu (copper), Ni (nickel), Ca, Mg (magnesium), Sr, Yb (ytterbium), Er (erbium), Tb (terbium), and Sm (samarium).

The second cathode layer covers the first cathode layer to protect it from chemical reactions with oxygen or water, and enhances the conductivity of the cathode 50. The material of the second cathode layer is, therefore, not limited to metals, and any material may be used as long as it has a low work function. Also, the second cathode layer may be in a single layer form. For a so-called top emission EL display device, a suitable transparent material, ITO, may be used. Other transparent materials include metal compounds containing zinc (Zn), such as indium zinc oxide amorphous transparent conductive film (IZO, registered trademark, produced by Idemitsu Kosan Co., Ltd.).

In the present exemplary embodiment, a cathode 50 including a Ca first cathode layer and an Al second cathode layer is illustrated.

However, the cathode 50 is not limited to the above-described composite including the first and second cathode layers, and it may be formed of a mixture of the materials of the first and second cathode layers.

The vicinity of the driving TFTs 123 in the effective display region 4 will now be described with reference to FIG. 5. FIG. 5 shows a cross section of the pixel region X, taken along plane A-B in FIG. 2.

As shown in FIG. 5, a protective underlayer 281 essentially composed of $SiO_2$ and silicon layers 241 are formed, in that order, on the substrate 20. The surface of each silicon layer 241 is covered with a gate insulating layer 282 principally containing at least one of $SiO_2$ and SiN.

The region of the silicon layer 241 opposing a gate electrode 242 with the gate insulating layer 282 therebetween is a channel region 241a. The gate electrode 242 is included in the scanning line 101 not shown in the figure. The surface of the gate insulating layer 282 covering the silicon layer 241 and having the gate electrode 242 is covered with a first insulating interlayer 283 principally containing $SiO_2$.

The silicon layer 241 also includes a lightly doped source region 241b and a heavily doped source region 241S at the source side of the channel region 241a, and a lightly doped drain region 241c and a heavily doped drain region 241D at the drain side of the channel region 241a, thus having a so-called LDD (light doped drain) structure. The heavily doped source region 241S is connected to a source electrode 243 through a contact hole 243a formed in the gate insulating layer 282 and the first insulating interlayer 283. The source electrode 243 is included in the foregoing power line 103 (see FIG. 1, extending from the source electrode 243 in FIG. 5 perpendicular to the face of the figure). The heavily doped drain region 241D is connected to a drain electrode 244 formed in the same layer as the source electrode 243 through a contact hole 244a formed in the gate insulating layer 282 and the first insulating interlayer 283.

The upper surface of the first insulating interlayer 283 having the source electrode 243 and the drain electrode 244 is covered with a second insulating interlayer 284 principally containing, for example, an acrylic resin. The second insulating interlayer 284 may be formed of SiN or $SiO_2$, in addition to the acrylic insulative resin. The ITO pixel electrodes 23 are disposed on the upper surface of the second insulating interlayer 284, and are each connected to the corresponding drain electrode 244 through a contact hole 23a formed in the second insulating interlayer 284. Thus, each pixel electrode 23 is connected to the heavily doped drain region 241D of the silicon layer 241 through the drain electrode 244.

Driving circuit TFTs included in the scanning line driving circuits 80 and the test circuit 90, which are n-channel or p-channel TFTs constituting an inverter of a shift register, also have the same structure as the other driving TFTs 123 except that they do not connected to the pixel electrodes 23.

The surface of the second insulating interlayer 284 having the pixel electrodes 23 is covered with a lyophilic control layer 25 principally containing a lyophilic material, such as $SiO_2$, and an organic bank layer 221 including, for example, acrylic resin, polyimide, or the like. The lyophilic control layer 25 and the organic bank layer 221 have openings 25a and 221a, respectively, corresponding to the pixel electrodes 23. A hole injection/transport layer 70 and the organic EL layer 60 are deposited, in that order, on the surface of the each pixel electrode 23 in the openings 25a and 221a. In the exemplary embodiment "Lyophilic" of the lyophilic control layer 25 means that the control layer has an affinity for liquid higher than that of at least the material of the organic bank layer 221, such as an acrylic resin or polyimide.

These layers from the substrate 20 to the second insulating interlayer 284 constitute the circuit portion 11.

In the EL display device 1 of the present exemplary embodiment, for display color images, a black matrix (BM), not shown in the figure, is disposed between the organic bank layer 221 and the lyophilic control layer 25 at the boundaries between the organic EL regions 60R, 60G, and 60B arranged corresponding to the display regions R, G, and B, respectively, by metallic chromium sputtering or the like.

In the EL display device 1 having the above-described structure, each surface of the organic EL layers 60R, 60G, and 60B is covered with the ultra-thin electron injection layer 52 including LiF and $SrF_2$ in a mixture form. Thus, electrons can be efficiently injected into each of the R, G, and B organic EL layers 60R, 60G, and 60B. Specifically, LiF injects electrons from the cathode to the B organic EL layers 60B in the organic EL layers 60; and $SrF_2$, to the R and G organic EL layers 60R and 60G. When current flows to the anode, holes are injected into the organic EL layers 60 and the holes combine with electrons. Consequently, the organic EL layers 60 emit light, thus producing a full color image with suitable gradation. Since the electron injection layer 52 contains the plurality of metal compounds, the luminescence characteristics of each of the organic EL layers 60R, 60G, and 60B can be enhanced to display full color images with suitable gradation.

In addition, since the cathode 50 contains a reducing metal compound, that is, Ca, the LiF and $SrF_2$ are reduced by Ca to liberate Li and Sr. Thus, the organic EL layers 60 are doped with the Li and Sr. The Li and Sr disperse into the organic EL layers 60 to merge with the macromolecules in the organic EL layers 60. Thus, the electron injection layer 52 and the organic EL layers 60 intertwine with each other, thereby enhancing the electron injection characteristics. Hence, the reducing metal enhances the luminescence characteristics of the organic EL layers 60. Furthermore, the EL display device 1 can produce RGB color images with gradation.

Method to Manufacture the EL Display Device

A method to manufacture the EL display device 1 of the present exemplary embodiment will be illustrated in detail with reference to FIGS. 6 to 11. FIGS. 6 to 10 are sectional views of manufacturing steps, taken along plane A-B in FIG. 2. FIG. 11 is a schematic illustration of a vapor deposition apparatus used to manufacture the EL display device 1.

Figure 6A:
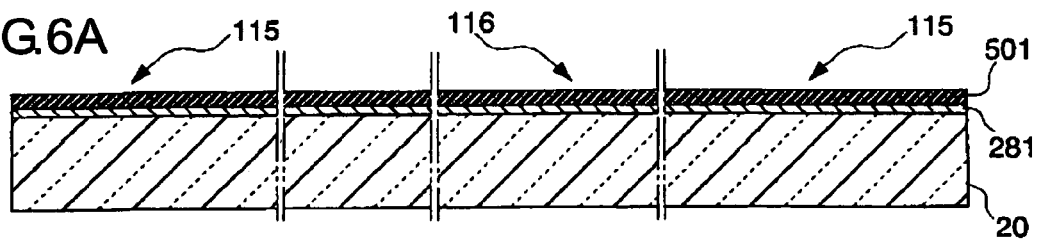
FIGS. 6(A)–6(D) are a process representation of the EL display device according to the first exemplary embodiment.

As shown in FIG. 6A, first the protective underlayer 281 is formed on the surface of the substrate 20. An amorphous silicon layer 501 is deposited on the protective underlayer 281 by ICVD or plasma CVD, and is then crystallized to form a polysilicon layer by laser annealing or flash heating.

Figure 6B:
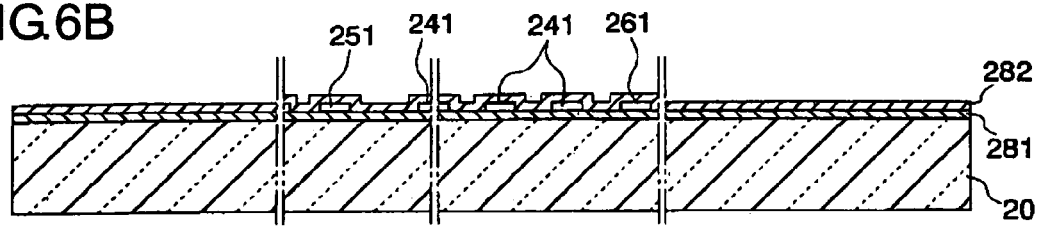

Turning to FIG. 6(B), the polysilicon layer is patterned by photolithography to form silicon layers 241, 251, and 261 in an island-shaped manner. The silicon layers 241 among these are disposed in the display region and included in the respective driving TFTs 123 connected to the pixel electrodes 23. The silicon layers 251 and 261 respectively constitute a p-channel and an n-channel TFT (driving circuit TFTs) included in the scanning line driving circuits 80.

Then, the gate insulating layer 282 is deposited to a thickness in the range of about 30 to 200 nm over the entire surfaces of the silicon layers 241, 251, and 261 and the protective underlayer 281 by plasma CVD or heat oxidation. If heat oxidation is applied, the silicon layers 241, 251, and 261 may be crystallized simultaneously with the formation of the gate insulating layer 282, thereby forming polysilicon layers from the silicon layers.

Also, if the silicon layers 241, 251, and 261 are channel-doped, boron ions are implanted at a dosage of about $1 \times 10^{12}$ cm$^{-2}$ at this time. Consequently, the silicon layers 241, 251, and 261 become lightly doped p-type silicon layers containing about $1 \times 10^{17}$ cm$^{-3}$ of dopant (calculated using the dopant after activation annealing).

Then, phosphorus ions are implanted at a dosage of about $1 \times 10^{15}$ cm$^{-2}$ through an ion implantation mask provided on parts of the channel layers of the p-channel TFT and n-channel TFT. As a result, a high concentration of dopant is introduced into the patterning mask in a self-aligning manner. Thus, heavily doped source regions, 241S and 261S, and heavily doped drain regions, 241D and 261D, are formed in the silicon layers 241 and 261, as shown in FIG. 6(C).

Figure 6C:
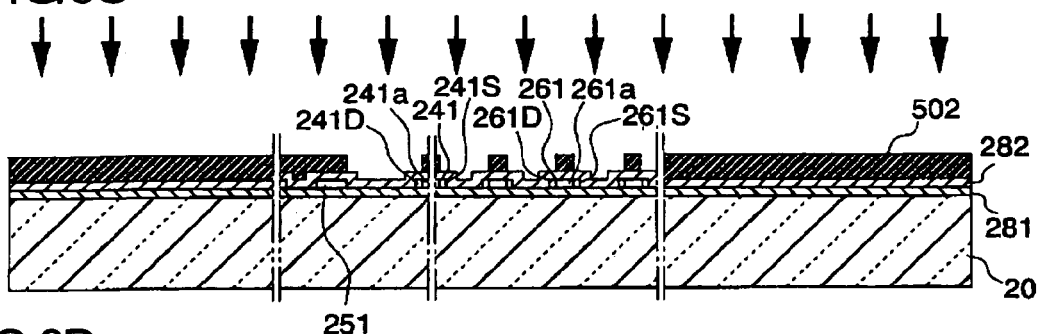
Figure 6D:
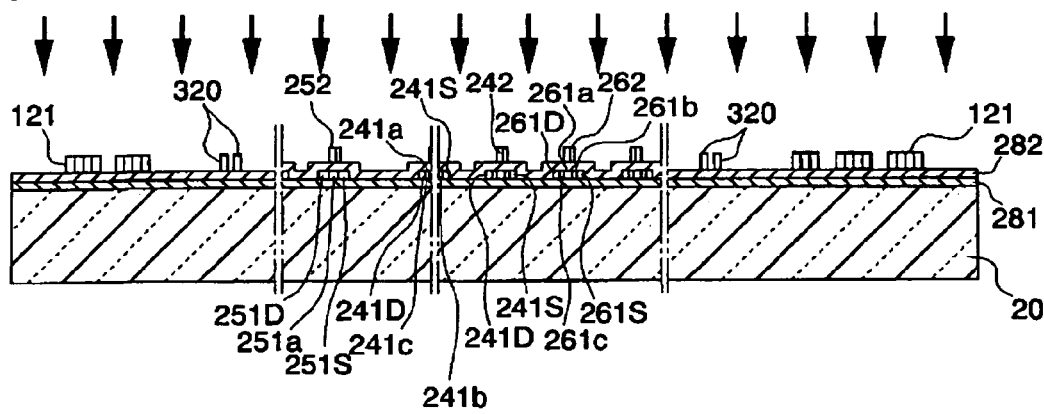

Then, a gate electrode-forming conductive layer 502 is formed of a doped silicon, a silicide, or a metal film, such as that of aluminum, chromium, or tantalum, over the entire surface of the gate insulating layer 282, as shown in FIG. 6(C). The conductive layer 502 has a thickness of about 500 nm. Subsequently, a gate electrode 252 of the p-channel driving circuit TFT, the gate electrodes 242 of the pixel TFTs, and a gate electrode 262 of the n-channel driving circuit TFT are formed by patterning, as shown in FIG. 6(D). In addition, the drive control signal conductors 320 (350) and first layers 121 of cathode power supply lines are formed at this moment. In this instance, the drive control signal conductors 320 (350) are disposed in the dummy region 5.

Turning to FIG. 6(D), phosphorus ions are implanted into the silicon layers 241, 251, and 261 at a dosage of about $4 \times 10^{13}$ cm$^{-2}$ using the gate electrodes 242, 252, and 262 as masks. As a result, a low concentration of dopant is introduced into the gate electrodes 242, 252, and 262 in a self-aligning manner. Thus, lightly doped source regions 241b and 261b and lightly doped drain regions 241c and 261c are formed in the silicon layers 241 and 261, as shown in FIGS. 6(C) and 6(D). In the silicon layer 251, lightly doped regions 251S and 251D are formed.

Turning to FIG. 7(E), an ion implantation mask 503 is provided so as to cover the entire surface except the p-channel driving circuit TFT 252. Boron ions are implanted into the silicon layer 251 at a dosage of about $1.5 \times 10^{15}$ cm$^{-2}$ through the ion implantation mask 503. As a result, the silicon layer 252 is doped with a high concentration of dopant in a self-aligning manner because the gate electrode 252 of the p-channel driving circuit TFT also serves as a mask. Thus, the lightly doped regions 251S and 251D are counter-doped to form a source region and a drain region of the p-channel driving circuit TFT.

Turning to FIG. 7(F), the first insulating interlayer 283 is formed over the entire surface of the substrate 20, and is subsequently patterned, to form contact holes C corresponding to the positions of the source and drain electrodes of each TFT, by photolithography.

Figure 8H:
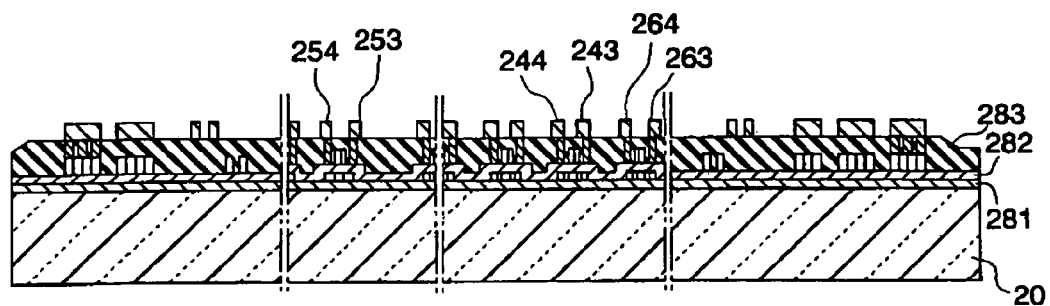
FIGS. 8(H)–8(J) are a process representation of the EL display device according to the first exemplary embodiment.

Turning to FIG. 7(G), a conductive layer 504 is formed of a metal, such as Al, Cr, or Ta, to cover the first insulating interlayer 283. The conductive layer 504 has a thickness in the range of about 200 to 800 nm. Then, on the conductive layer 504, the patterning masks 505 are provided to cover the regions 240*a* where the source and drain electrodes of the TFTs will be formed, the regions 310*a* where the driving voltage conductors 310 (340) will be formed, and the regions 122*a* where a second layer of the cathode power supply line will be formed. The conductive layer 504 is patterned to form source electrodes 243, 253, and 263 and drain electrodes 244, 254, and 254 as shown in FIG. 8(H).

Figure 8I:
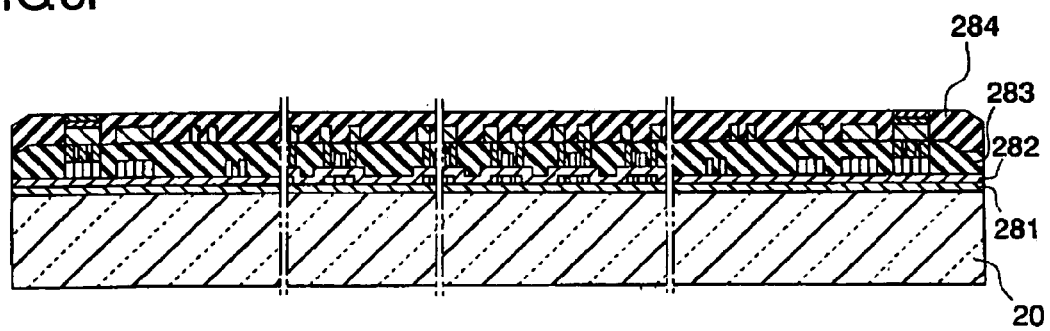

Turning to FIG. 8(I), the second insulating interlayer 284 to cover the first insulating interlayer 283 having these source and drain electrodes is formed of a macromolecular material, such as an acrylic resin. Preferably, the second insulating interlayer 284 has a thickness in the range of about 1 to 2 μm. The second insulating interlayer may be formed of SiN or $SiO_2$. In this instance, preferably, the thickness of a SiN second insulating interlayer is set at about 200 nm, and the thickness of a $SiO_2$ second insulating interlayer is set about 800 nm.

Figure 8J:
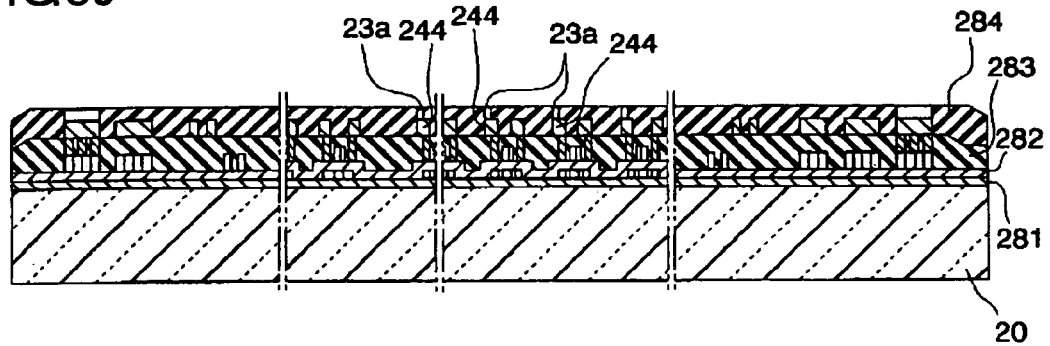

Turning to FIG. 8(J), contact holes 23*a* are formed in the second insulating interlayer 284 by etching to remove the regions corresponding to the drain electrodes 244 of the driving TFTs.

Figure 9K:
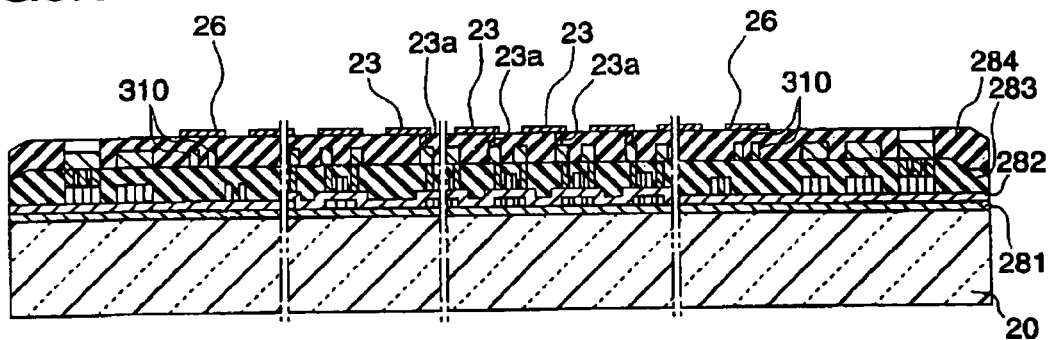
FIGS. 9(K)–9(M) are a process representation of the EL display device according to the first exemplary embodiment.

Then, a transparent conductive layer for the pixel electrodes 23 is formed to cover the entire surface of the substrate 20. The transparent conductive layer is patterned to the pixel electrodes 23 electrically connected to the respective drain electrodes 244 through the contact holes 23*a*, and to dummy patterns 26 in the dummy region, as shown in FIG. 9(K). The pixel electrodes 23 shown in FIGS. 3 and 4 collectively include the actual pixel electrodes 23 and the dummy patterns 26.

The dummy patterns 26 are not connected to underlying metal wires through the second insulating interlayer 284. Specifically, the dummy patterns 26 are disposed in an island-shaped manner and have substantially the same shape as the pixel electrodes 23 disposed in the effective display region. The dummy patterns 26 may of course have a different shape from that of the pixel electrodes 23. In this instance, the dummy patterns 26 are disposed at least over the driving voltage conductors 310 (340).

Figure 9L:
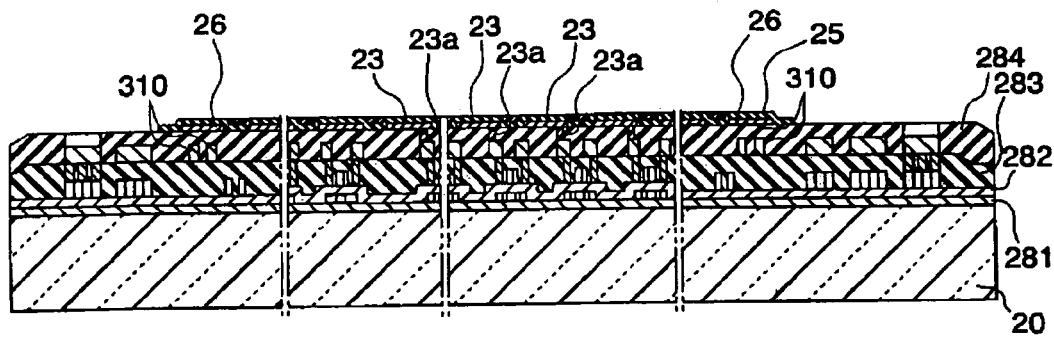

Turning to FIG. 9(L), the lyophilic control layer 25, which is an insulating layer, is formed over the pixel electrodes 23, the dummy patterns 26, and the second insulating interlayer 284. The lyophilic control layer 25 has openings 25*a* (see FIG. 3 together) over the pixel electrodes 23 so that holes can transfer from the pixel electrodes 23. In contrast, over the dummy patterns 26 not having the openings 25*a*, the insulating lyophilic control layer 25 functions as a hole transfer block layer to prevent hole from transferring.

Subsequently, as shown in FIG. 9(L), the BM is formed in the recess of the lyophilic control layer 25 between each two adjacent pixel electrodes 23. More specifically, metallic chromium is deposited in the recesses of the lyophilic control layer 25 by sputtering.

Figure 9M:
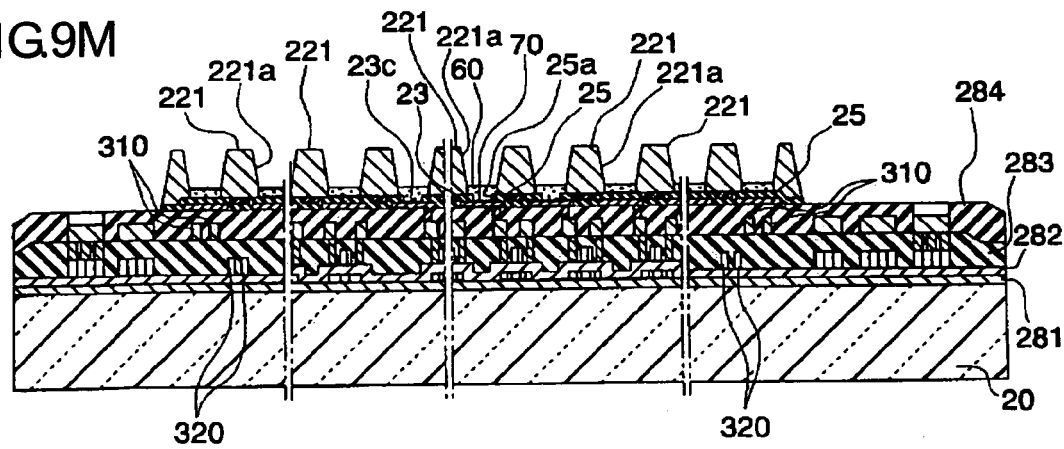

Turning to FIG. 9(M), the organic bank layer 221 is formed in predetermined regions of the lyophilic control layer 25 so as to cover the BM. For the organic bank layer 221, a resist, such as an acrylic resin or a polyimide resin, is dissolved in a solvent and this solution is applied to form an organic layer by spin coating, dip coating, or the like. Any material can be used for the organic layer, as long as it is insoluble in solvents for an ink described later and easy to pattern by etching.

Then, the organic layer is simultaneously etched by photolithography or the like to form openings 221*a*. Thus the organic bank layer 221 having the openings 221*a* with side walls is obtained. In this instance, the organic bank 221 is disposed at least over the drive control signal conductors 320.

The surface of the organic bank layer 221 is provided with lyophilic regions and liquid-repellent regions. In the present exemplary embodiment, these regions are formed by a plasma treatment process. The plasma treatment process includes: a preheating; giving ink-philic characteristics or lyophilic characteristics to the side surfaces of the openings 221*a* of the organic bank layer 221, the electrode surfaces 23*c* of the pixel electrodes 23, and the upper surface of the lyophilic control layer 25; giving ink-repellent characteristics to the upper surface of the organic bank layer 221 and the wall surface of the openings, and cooling.

Specifically, the base material (substrate 20 having the bank layer and other layers) is heated to a predetermined temperature (for example, about 70 to 80° C.), and subsequently, in the step of giving ink-philic characteristics, the base material is subjected to plasma treatment ($O_2$ plasma treatment) in an atmosphere of air, using oxygen as a reaction gas. Then, in the step of giving ink-repellent characteristics, plasma treatment ($CF_4$ plasma treatment) is performed in an atmosphere of air, using tetrafluoromethane as a reaction gas. The substrate heated for the plasma treatments is cooled down to room temperature and, thus, the ink-philic and ink-repellent characteristics are given to the specific regions separately.

The electrode surfaces 23*c* of the pixel electrodes 23 and the lyophilic control layer 25 are affected to some extent by the $CF_4$ plasma treatment. However, the materials of the pixel electrode 23, such as ITO, and the lyophilic control layer 25, such as $SiO_2$ or $TiO_2$, do not have affinity to fluorine. Accordingly, hydroxy groups introduced in the step of giving ink-philic characteristics are not replaced with fluoride groups, and the ink-philic characteristics are thus maintained.

Figure 10N:
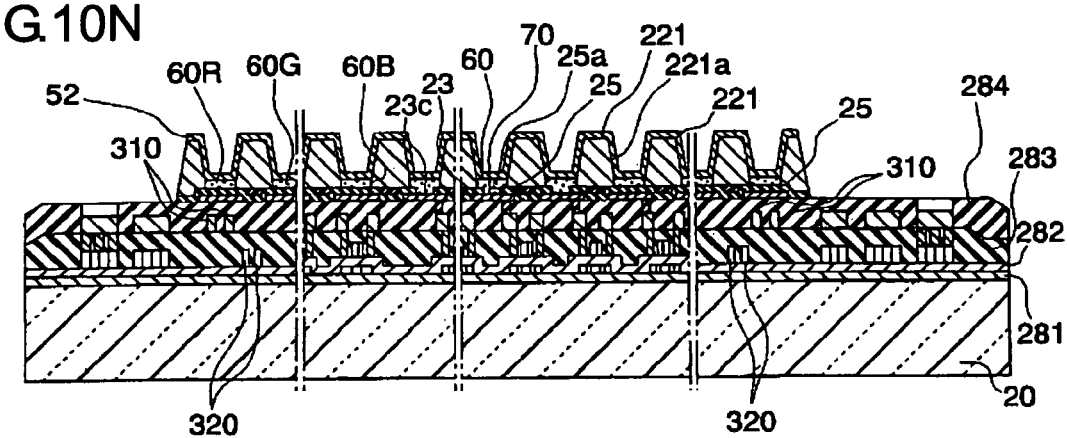
FIGS. 10(N)–10(O) are a process representation of the EL display device according to the first exemplary embodiment.
Figure 11:
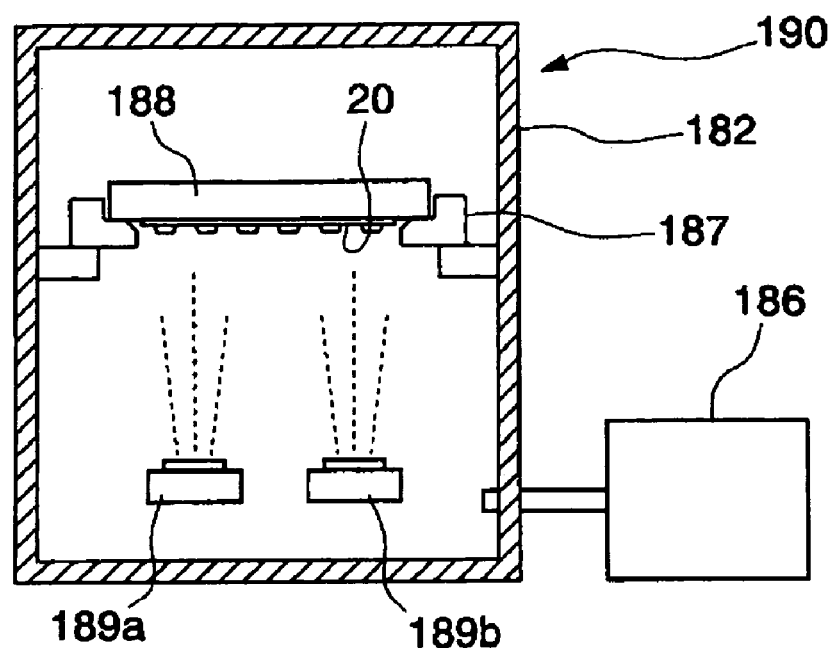
FIG. 11 shows a vapor deposition apparatus to manufacture the EL display device according to the first exemplary embodiment.

Turning to FIG. 10(N), hole injection/transport layers 70 are formed in the step of forming hole injection/transport layers. In this step, an ink containing materials of the hole injection/transport layers is deposited on the electrode surfaces 23*c* by an ink jet technique, followed by drying. Thus, the hole injection/transport layers 70 are formed on the electrodes 23. Preferably, this hole injection/transport layer forming step and subsequent steps are performed in an atmosphere of an inert gas, such as nitrogen or argon, in order to prevent the hole injection/transport layers 70 and the organic EL layers 60 from oxidizing.

In the ink jet technique, a discharge head (not shown in the figure), filled with an ink containing the material of the hole injection/transport layers 70, such as PEDOT:PSS, discharges a controlled amount of droplets of the ink onto the electrode surfaces 23*c* from discharge nozzles opposed to the electrode surfaces 23*c* in the openings 25*a* in the lyophilic control layer 25 while being shifted relative to the base material (substrate 20). Then, the discharged ink drops are dried to evaporate the polar solvent contained in the ink. Thus the hole injection/transport layer 70 is formed.

The ink is prepared by dissolving, for example, PEDOT: PSS in a polar solvent, such as isopropyl alcohol. Discharged ink drops spread over the surfaces of the electrode surfaces 23*c* subjected to the ink-philic treatment and the bottoms of the openings 25*a* of the lyophilic control layer 25. On the other hand, the surface of the organic bank layer 221 repels the ink drops because of the ink-repellent characteristics. Therefore, even if an ink drop deviates from predetermined discharge positions to land on the surface of the organic bank layer 221, the surface is not wetted with the ink drop, and the repelled ink drop falls into the opening 25a of the lyophilic control layer 25.

Turning to FIG. 10(N), the organic EL layers 60 are formed in the step of forming the organic EL layers. In this step, inks each containing a material of the organic EL layers are discharged on the hole injection/transport layers 70 by an ink jet technique, as in above, followed by drying and heating. Thus, the organic EL layers 60 are formed in the openings 221a of the organic bank layer 221.

In the organic EL layer forming step, a nonpolar material incapable of dissolving the hole injection/transport layers 70 is used as a solvent of the ink for the organic EL layers to prevent the hole injection/transport layers 70 from redissolving.

In the organic EL layer forming step, for example, a discharge head (not shown in the figure) filled with an ink containing the material of the blue (B) organic EL layers 60 discharges a controlled amount of droplets of the ink onto the hole injection/transport layers 70 from discharge nozzles opposed to the hole injection/transport layers 70 in the openings 25a of the insulative lyophilic control layer 25 while being shifted relatively with respect to the base material (substrate 20).

Discharged ink drops spread over the surfaces of the hole injection/transport layers 70, thus filling the openings 25a of the lyophilic control layer 25. On the other hand, the surface of the ink-repellent organic bank layer 221 repels the ink drops because of the ink-repellent characteristics. Therefore, even if an ink drop deviates from predetermined discharge positions to land on the surface of the organic bank layer 221, the surface is not wetted with the ink drop, and the repelled ink drop falls into the openings 25a of the lyophilic control layer 25. Thus, the ink is deposited in the openings 221a of the bank layer 221 to fill. Then, the discharged ink drops are dried to evaporate the nonpolar solvent contained in the ink, and thus the organic EL layers 60 are formed. For R, G, and B color organic EL layers, respective inks are discharged corresponding to the respective R, G, and B display regions.

The hole injection/transport layers 70 and the organic EL layers 60 are formed by the respective ink jet processes with the angles of the discharge heads controlled according to the dot pitch of luminescence.

Then, the electron injection layer 52 is formed on the organic EL layers 60, as shown in FIG. 10(N), in the step of forming the electron injection layer by vapor codeposition using a deposition apparatus shown in FIG. 11. In the present exemplary embodiment, LiF and $SrF_2$ are used for the electron injection layer 52.

The deposition apparatus 180 shown in FIG. 11 includes a treatment chamber 182, a vacuum controller 186 to evacuate the treatment chamber 182, a substrate holder 187 to hold a substrate 20 to be subjected to vapor deposition, a temperature controller 188 to control the temperature of the substrate 20 to a predetermined value, and deposition sources 189a and 189b to heat materials. The deposition source 189a contains LiF and the deposition source 189b contains $SrF_2$.

In the deposition apparatus 180, in which the treatment chamber 182 is controlled to a predetermined temperature and pressure and the temperature of the substrate 20 is set at a predetermined value, the deposition sources 189a and 189b vaporize respective different materials to deposit the mixture of the different materials onto the substrate 20, thus forming a uniform thin film of the mixture over the surface of the substrate 20. The deposition apparatus 180 facilitates the formation of not only a thin film containing a mixture of desired materials, but also the thin film with a thickness on the order of nanometers.

In this step of forming the electron injection layer using the 180 facilitates, first, LiF and $SrF_2$ are placed in the deposition sources 189a and 189b respectively, and the LiF and $SrF_2$ are uniformly vapor-deposited. The molecules of the deposited LiF and $SrF_2$ are mixed to form a dense ultra-thin film. Thus, the LiF and $SrF_2$ are involved in the organic EL layers 60 to come in contact with the organic EL layers 60 in terms of electron injection.

Preferably, the mixture ratio of the LiF to $SrF_2$ in the electron injection layer 52 is 1:4. This ratio results in the best RBG luminous balance.

Figure 10O:
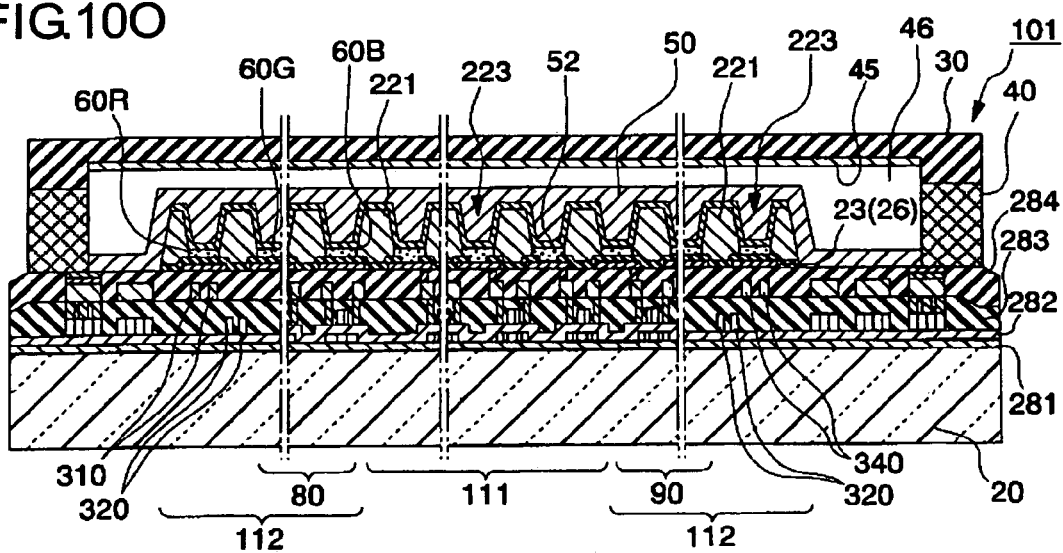

Turning to FIG. 10(O), the cathode 50 is formed by vapor deposition in the step of forming the cathode layer. The cathode 50 includes a first cathode layer and a second cathode layer. The first cathode layer is preferably formed of Ca, which reduces the LiF and $SrF_2$ in the electron injection layer 52, and the second cathode layer is formed of a conductive material capable of protecting the first cathode layer from oxygen and water, and preferably of Al. The cathode 50 is uniformly deposited over the entire surface of the electron injection layer 52.

Finally, the sealing substrate 30 is formed in the step of forming the sealing substrate, as shown in FIG. 10(O). The sealing substrate 30 is bonded to the substrate 20 with an adhesive 40, having the dryer 45 inside. Preferably, this step is performed in an atmosphere of an inert gas, such as nitrogen, argon, or helium.

In the above-described process, the ultra-thin electron injection layer 52 containing the plurality of metal compounds, i.e., LiF and $SrF_2$, is provided by vapor codeposition. Consequently, the resulting EL display device has organic EL layers 60 exhibiting enhanced luminescence characteristics. In addition, the cathode 50 including the Ca layer provided by vapor deposition enhances the luminescence characteristics of the organic EL layers 60 because Ca reduces LiF and SrF.

Moreover, since the electron injection layer 52 and the cathode 50 are uniformly formed through a series of depositions over the entire surface without patterning by mask deposition, the manufacture of the EL display device can be facilitated. Furthermore, since the electron injection layer 52 and the cathode 50 are uniformly provided, the resulting EL display device can produce RGB color images with gradation.

Second Exemplary Embodiment

A second exemplary embodiment of the electro-optic device of the present invention will now be illustrated.

While the electron injection layer 52 of the first exemplary embodiment contains a mixture of a plurality of metal compounds, the electron injection layer 52 of the second exemplary embodiment includes a plurality of layers formed by depositing a plurality of metal compounds in a predetermined order.

The first exemplary embodiment and the second exemplary embodiment provide substantially the same structure except for the electron injection layer 52. In the present exemplary embodiment, only the difference from the first exemplary embodiment will be described, and the same parts are designated by the same reference numerals.

Metal compounds for the electron injection layer 52 principally contain at least one of alkali metals, alkaline earth metals, and rare earth metals, and preferably their fluorides, oxides, and chlorides. FIGS. 12 and 13 show properties of exemplary metals among alkali metals, alkaline earth metals, and rare earth metals. FIG. 14 shows melting points of exemplary fluorides, oxides, and chlorides of alkali metals, alkaline earth metals, and rare earth metals.

However, these compounds are only examples, and the materials of the electron injection layer 52 are not limited to these.

The electron injection layer 52 of the second exemplary embodiment includes a first metal compound layer disposed at the organic EL layers 60 side and a second metal compound layer disposed on the first metal compound layer. These two layers are deposited in a predetermined order.

The deposition order is specified according to: (1) chemical bonding forces; (2) valences of the metal elements of the metal compounds; (3) ionic radiuses of the metal ions of the metal compounds; or (4) work functions of the metal elements of the metal compounds.

Above listed (1) to (4) will now be described in detail.

1. Order Specified According to Chemical Bonding Forces of the Metal Compounds)

Specifying "according to chemical bonding forces" means the order of deposition is set according to the melting points of the metal compounds using as a measure, the stability of the metal compounds. The second layer has a chemical bonding force larger than that of the first layer.

For example, if fluorides are used for the first layer and the second layer, preferably, a first layer/second layer structure is selected from the group including CsF/LiF, CsF/NaF, CsF/KF, CsF/RbF, RbF/KF, RbF/NaF, RbF/LiF, KF/NaF, KF/LiF, NaF/LiF, LiF/MgF$_2$, LiF/CaF$_2$, LiF/SrF$_2$, LiF/BaF$_2$, CaF$_2$/MgF$_2$, CaF$_2$/BaF$_2$, CaF$_2$/SrF$_2$, BaF$_2$/SrF$_2$, BaF$_2$/MgF$_2$, and SrF$_2$/BaF$_2$.

If a fluoride and an oxide are used for the first layer and the second layer respectively, a first layer/second layer structure is preferably selected from the group including LiF/Li$_2$O, LiF/Na$_2$O, LiF/K$_2$O, LiF/Rb$_2$O, LiF/Cs$_2$O, KF/Li$_2$O, KF/Na$_2$O, KF/K$_2$O, KF/Rb$_2$O, KF/Cs$_2$O, RbF/Li$_2$O, RbF/Na$_2$O, RbF/K$_2$O, RbF/Rb$_2$O, RbF/Cs$_2$O, CsF/Li$_2$O, CsF/Na$_2$O, CsF/K$_2$O, CsF/Rb$_2$O, CsF/Cs$_2$O, MgF$_2$/MgO, MgF$_2$/CaO, MgF$_2$/SrO, MgF$_2$/BaO, CaF$_2$/MgO, CaF$_2$/CaO, CaF$_2$/SrO, CaF$_2$/BaO, SrF$_2$/MgO, SrF$_2$/CaO, SrF$_2$/SrO, SrF$_2$/BaO, BaF$_2$/MgO, BaF$_2$/CaO, BaF$_2$/SrO, and BaF$_2$/BaO.

If chlorides are used for the first and second layers, a first layer/second layer structure is selected from the group including CsCl/RbCl, CsCl/NaCl, and CsCl/BaCl$_2$.

Preferably, the first and second layers each have a thickness in the range of about 50 to 200 nm.

By specifying the deposition order of metal compounds according to chemical bonding forces of the metal compounds, not only are the same effects as in the foregoing exemplary embodiment produced, but also electrons are efficiently injected and transported to the luminescent layer to exhibit superior luminescence characteristics due to the difference between the chemical bonding forces.

2. Order Specified According to Valences of the Metal Elements of the Metal Compounds)

Metal compounds are deposited in such an order that the metal element of the second layer has a valence higher than that of the metal element of the first layer.

Valences of metal elements increase in the order of alkali metals, alkaline earth metals, and rare earth metals. For example, if a fluoride of a monovalent metal and a fluoride of a divalent or trivalent metal are used for the first layer and the second layer respectively, a first layer/second layer structure is selected from the group including LiF/MgF$_2$, LiF/CaF$_2$, LiF/SrF$_2$, LiF/BaF$_2$, LiF/LaF$_3$, LiF/CeF$_3$, LiF/PrF$_3$, LiF/NdF$_3$, LiF/SmF$_3$, LiF/EuF$_3$, LiF/GdF$_3$, LiF/TbF$_3$, LiF/DyF$_3$, LiF/HoF$_3$, LiF/ErF$_3$, LiF/TmF$_3$, LiF/YbF$_3$, LiF/LuF$_3$, LiF/YF$_3$, NaF/MgF$_2$, NaF/CaF$_2$, NaF/SrF$_2$, NaF/BaF$_2$, NaF/LaF$_3$, NaF/CeF$_3$, NaF/PrF$_3$, NaF/NdF$_3$, NaF/SmF$_3$, NaF/EuF$_3$, NaF/GdF$_3$, NaF/TbF$_3$, NaF/DyF$_3$, NaF/HoF$_3$, NaF/ErF$_3$, NaF/TmF$_3$, NaF/YbF$_3$, NaF/LuF$_3$, NaF/YF$_3$, KF/MgF$_2$, KF/CaF$_2$, KF/SrF$_2$, KF/BaF$_2$, KF/LaF$_3$, KF/CeF$_3$, KF/PrF$_3$, KF/NdF$_3$, KF/SmF$_3$, KF/EuF$_3$, KF/GdF$_3$, KF/TbF$_3$, KF/DyF$_3$, KF/HoF$_3$, KF/ErF$_3$, KF/TmF$_3$, KF/YbF$_3$, KF/LuF$_3$, KF/YF$_3$, RbF/MgF$_2$, RbF/CaF$_2$, RbF/SrF$_2$, RbF/BaF$_2$, RbF/LaF$_3$, RbF/CeF$_3$, RbF/PrF$_3$, RbF/NdF$_3$, RbF/SmF$_3$, RbF/EuF$_3$, RbF/GdF$_3$, RbF/TbF$_3$, RbF/DyF$_3$, RbF/HoF$_3$, RbF/ErF$_3$, RbF/TmF$_3$, RbF/YbF$_3$, RbF/LuF$_3$, RbF/YF$_3$, CsF/MgF$_2$, CsF/CaF$_2$, CsF/SrF$_2$, CsF/BaF$_2$, CsF/LaF$_3$, CsF/CeF$_3$, CsF/PrF$_3$, CsF/NdF$_3$, CsF/SmF$_3$, CsF/EuF$_3$, CsF/GdF$_3$, CsF/TbF$_3$, CsF/DyF$_3$, CsF/HoF$_3$, CsF/ErF$_3$, CsF/TmF$_3$, CsF/YbF$_3$, CsF/LuF$_3$, and CsF/YF$_3$.

If an oxide of a monovalent metal and a fluoride of a divalent or trivalent metal are used for the first layer and the second layer respectively, a first layer/second layer structure is selected from the group including Na$_2$O/MgF$_2$, Na$_2$O/CaF$_2$, Na$_2$O/SrF$_2$, Na$_2$O/BaF$_2$, Na$_2$O/LaF$_3$, Na$_2$O/CeF$_3$, Na$_2$O/PrF$_3$, Na$_2$O/NdF$_3$, Na$_2$O/SmF$_3$, Na$_2$O/EuF$_3$, Na$_2$O/GdF$_3$, Na$_2$O/TbF$_3$, Na$_2$O/DyF$_3$, Na$_2$O/HoF$_3$, Na$_2$O/ErF$_3$, Na$_2$O/TmF$_3$, Na$_2$O/YbF$_3$, Na$_2$O/LuF$_3$, Na$_2$O/YF$_3$, Na$_2$O/MgF$_2$, Na$_2$O/CaF$_2$, Na$_2$O/SrF$_2$, Na$_2$O/BaF$_2$, Na$_2$O/LaF$_3$, Na$_2$O/CeF$_3$, Na$_2$O/PrF$_3$, Na$_2$O/NdF$_3$, Na$_2$O/SmF$_3$, Na$_2$O/EuF$_3$, Na$_2$O/GdF$_3$, Na$_2$O/TbF$_3$, Na$_2$O/DyF$_3$, Na$_2$O/HoF$_3$, Na$_2$O/ErF$_3$, Na$_2$O/TmF$_3$, Na$_2$O/YbF$_3$, Na$_2$O/LuF$_3$, Na$_2$O/YF$_3$, Rb$_2$O/MgF$_2$, Rb$_2$O/CaF$_2$, Rb$_2$O/SrF$_2$, Rb$_2$O/BaF$_2$, Rb$_2$O/LaF$_3$, Rb$_2$O/CeF$_3$, Rb$_2$O/PrF$_3$, Rb$_2$O/NdF$_3$, Rb$_2$O/SmF$_3$, Rb$_2$O/EuF$_3$, Rb$_2$O/GdF$_3$, Rb$_2$O/TbF$_3$, Rb$_2$O/DyF$_3$, Rb$_2$O/HoF$_3$, Rb$_2$O/ErF$_3$, Rb$_2$O/TmF$_3$, Rb$_2$O/YbF$_3$, Rb$_2$O/LuF$_3$, Rb$_2$O/YF$_3$, Cs$_2$O/MgF$_2$, Cs$_2$O/CaF$_2$, Cs$_2$O/SrF$_2$, Cs$_2$O/BaF$_2$, Cs$_2$O/LaF$_3$, Cs$_2$O/CeF$_3$, Cs$_2$O/PrF$_3$, Cs$_2$O/NdF$_3$, Cs$_2$O/SmF$_3$, Cs$_2$O/EuF$_3$, Cs$_2$O/GdF$_3$, Cs$_2$O/TbF$_3$, Cs$_2$O/DyF$_3$, Cs$_2$O/HoF$_3$, Cs$_2$O/ErF$_3$, Cs$_2$O/TmF$_3$, Cs$_2$O/YbF$_3$, Cs$_2$O/LuF$_3$, and Cs$_2$O/YF$_3$.

If a chloride of a monovalent metal and a fluoride of a divalent or trivalent metal are used for the first layer and the second layer respectively, a first layer/second layer structure is selected from the group including NaCl/MgF$_2$, NaCl/CaF$_2$, NaCl/SrF$_2$, NaCl/BaF$_2$, NaCl/LaF$_3$, NaCl/CeF$_3$, NaCl/PrF$_3$, NaCl/NdF$_3$, NaCl/SmF$_3$, NaCl/EuF$_3$, NaCl/GdF$_3$, NaCl/TbF$_3$, NaCl/DyF$_3$, NaCl/HoF$_3$, NaCl/ErF$_3$, NaCl/TmF$_3$, NaCl/YbF$_3$, NaCl/LuF$_3$, NaCl/YF$_3$, NaCl/MgF$_2$, NaCl/CaF$_2$, NaCl/SrF$_2$, NaCl/BaF$_2$, NaCl/LaF$_3$, NaCl/CeF$_3$, NaCl/PrF$_3$, NaCl/NdF$_3$, NaCl/SmF$_3$, NaCl/EuF$_3$, NaCl/GdF$_3$, NaCl/TbF$_3$, NaCl/DyF$_3$, NaCl/HoF$_3$, NaCl/ErF$_3$, NaCl/TmF$_3$, NaCl/YbF$_3$, NaCl/LuF$_3$, NaCl/YF$_3$, KCl/MgF$_2$, KCl/CaF$_2$, KCl/SrF$_2$, KCl/BaF$_2$, KCl/LaF$_3$, KCl/CeF$_3$, KCl/PrF$_3$, KCl/NdF$_3$, KCl/SmF$_3$, KCl/EuF$_3$, KCl/GdF$_3$, KCl/TbF$_3$, KCl/DyF$_3$, KCl/HoF$_3$, KCl/ErF$_3$, KCl/TmF$_3$, KCl/YbF$_3$, KCl/LuF$_3$, KCl/YF$_3$, RbCl/MgF$_2$, RbCl/CaF$_2$, RbCl/SrF$_2$, RbCl/BaF$_2$, RbCl/LaF$_3$, RbCl/CeF$_3$, RbCl/PrF$_3$, RbCl/NdF$_3$, RbCl/SmF$_3$, RbCl/EuF$_3$, RbCl/GdF$_3$, RbCl/TbF$_3$, RbCl/DyF$_3$, RbCl/HoF$_3$, RbCl/ErF$_3$, RbCl/TmF$_3$, RbCl/YbF$_3$, RbCl/LuF$_3$, RbCl/YF$_3$, CsCl/MgF$_2$, CsCl/CaF$_2$, CsCl/SrF$_2$, CsCl/BaF$_2$, CsCl/LaF$_3$, CsCl/CeF$_3$, CsCl/PrF$_3$, CsCl/NdF$_3$, CsCl/SmF$_3$, CsCl/EuF$_3$, CsCl/GdF$_3$, CsCl/TbF$_3$, CsCl/DyF$_3$, CsCl/HoF$_3$, CsCl/ErF$_3$, CsCl/TmF$_3$, CsCl/YbF$_3$, CsCl/LuF$_3$, and CsCl/YF$_3$.

If a fluoride of a monovalent metal and an oxide of a divalent or trivalent metal are used for the first layer and the second layer respectively, a first layer/second layer structure is selected from the group including NaF/MgO, NaF/CaO, NaF/SrO, NaF/BaO, NaF/La$_2$O$_3$, NaF/Ce$_2$O, NaF/Pr$_2$O$_3$, NaF/Nd$_2$O$_3$, NaF/Sm$_2$O$_3$, NaF/Eu$_2$O$_3$, NaF/Gd$_2$O$_3$, NaF/Tb$_2$O$_3$, NaF/Dy$_2$O$_3$, NaF/Ho$_2$O$_3$, NaF/Er$_2$O$_3$, NaF/Tm$_2$O$_3$, NaF/Yb$_2$O$_3$, NaF/Lu$_2$O$_3$, NaF/Y$_2$O$_3$, NaF/MgO, NaF/CaO, NaF/SrO, NaF/BaO, NaF/La$_2$O$_3$, NaF/CeO$_2$, NaF/Pr$_2$O$_3$, NaF/Nd$_2$O$_3$, NaF/Sm$_2$O$_3$, NaF/Eu$_2$O$_3$, NaF/Gd$_2$O$_3$, NaF/Tb$_2$O$_3$, NaF/Dy$_2$O$_3$, NaF/Ho$_2$O$_3$, NaF/Er$_2$O$_3$, NaF/Tm$_2$O$_3$, NaF/Yb$_2$O$_3$, NaF/Lu$_2$O$_3$, NaF/Y$_2$O$_3$, KF/MgO, KF/CaO, KF/SrO, KF/BaO, KF/La$_2$O$_3$, KF/Ce$_2$O, KF/Pr$_2$O$_3$, KF/Nd$_2$O$_3$, KF/Sm$_2$O$_3$, KF/Eu$_2$O$_3$, KF/Gd$_2$O$_3$, KF/Tb$_2$O$_3$, KF/Dy$_2$O$_3$, KF/Ho$_2$O$_3$, KF/Er$_2$O$_3$, KF/Tm$_2$O$_3$, KF/Yb$_2$O$_3$, KF/Lu$_2$O$_3$, KF/Y$_2$O$_3$, RbF/MgO, RbF/CaO, RbF/SrO, RbF/BaO, RbF/La$_2$O$_3$, RbF/Ce$_2$O, RbF/Pr$_2$O$_3$, RbF/Nd$_2$O$_3$, RbF/Sm$_2$O$_3$, RbF/Eu$_2$O$_3$, RbF/Gd$_2$O$_3$, RbF/Tb$_2$O$_3$, RbF/Dy$_2$O$_3$, RbF/Ho$_2$O$_3$, RbF/Er$_2$O$_3$, RbF/Tm$_2$O$_3$, RbF/Yb$_2$O$_3$, RbF/Lu$_2$O$_3$, RbF/Y$_2$O$_3$, CsF/MgO, CsF/CaO, CsF/SrO, CsF/BaO, CsF/La$_2$O$_3$, CsF/Ce$_2$O, CsF/Pr$_2$O$_3$, CsF/Nd$_2$O$_3$, CsF/Sm$_2$O$_3$, CsF/Eu$_2$O$_3$, CsF/Gd$_2$O$_3$, CsF/Tb$_2$O$_3$, CsF/Dy$_2$O$_3$, CsF/Ho$_2$O$_3$, CsF/Er$_2$O$_3$, CsF/Tm$_2$O$_3$, CsF/Yb$_2$O$_3$, CsF/Lu$_2$O$_3$, and CsF/Y$_2$O$_3$.

If an oxide of a monovalent metal and an oxide of a divalent or trivalent metal are used for the first layer and the second layer respectively, a first layer/second layer structure is selected from the group including Na$_2$O/MgO, Na$_2$O/CaO, Na$_2$O/SrO, Na$_2$O/BaO, Na$_2$O/La$_2$O$_3$, Na$_2$O/CeO$_2$, Na$_2$O/Pr$_2$O$_3$, Na$_2$O/Nd$_2$O$_3$, Na$_2$O/Sm$_2$O$_3$, Na$_2$O/Eu$_2$O$_3$, Na$_2$O/Gd$_2$O$_3$, Na$_2$O/Tb$_2$O$_3$, Na$_2$O/Dy$_2$O$_3$, Na$_2$O/Ho$_2$O$_3$, Na$_2$O/Er$_2$O$_3$, Na$_2$O/Tm$_2$O$_3$, Na$_2$O/Yb$_2$O$_3$, Na$_2$O/Lu$_2$O$_3$, Na$_2$O/Y$_2$O$_3$, Rb$_2$O/MgO, Rb$_2$O/CaO, Rb$_2$O/SrO, Rb$_2$O/BaO, Rb$_2$O/La$_2$O$_3$, Rb$_2$O/CeO$_2$, Rb$_2$O/Pr$_2$O$_3$, Rb$_2$O/Nd$_2$O$_3$, Rb$_2$O/Sm$_2$O$_3$, Rb$_2$O/Eu$_2$O$_3$, Rb$_2$O/Gd$_2$O$_3$, Rb$_2$O/Tb$_2$O$_3$, Rb$_2$O/Dy$_2$O$_3$, Rb$_2$O/Ho$_2$O$_3$, Rb$_2$O/Er$_2$O$_3$, Rb$_2$O/Tm$_2$O$_3$, Rb$_2$O/Yb$_2$O$_3$, Rb$_2$O/Lu$_2$O$_3$, Rb$_2$O/Y$_2$O$_3$, Cs$_2$O/MgO, Cs$_2$O/CaO, Cs$_2$O/SrO, Cs$_2$O/BaO, Cs$_2$O/La$_2$O$_3$, Cs$_2$O/CeO$_2$, CS$_2$O/Pr$_2$O$_3$, Cs$_2$O/Nd$_2$O$_3$, Cs$_2$O/Sm$_2$O$_3$, Cs$_2$O/Eu$_2$O$_3$, Cs$_2$O/Gd$_2$O$_3$, Cs$_2$O/Tb$_2$O$_3$, Cs$_2$O/Dy$_2$O$_3$, Cs$_2$O/Ho$_2$O$_3$, Cs$_2$O/Er$_2$O$_3$, Cs$_2$O/Tm$_2$O$_3$, Cs$_2$O/Yb$_2$O$_3$, Cs$_2$O/Lu$_2$O$_3$, and Cs$_2$O/Y$_2$O$_3$.

If a chloride of a monovalent metal and an oxide of a divalent or trivalent metal are used for the first layer and the second layer respectively, a first layer/second layer structure is selected from the group including NaCl/MgO, NaCl/CaO, NaCl/SrO, NaCl/BaO, NaCl/La$_2$O$_3$, NaCl/CeO$_2$, NaCl/Pr$_2$O$_3$, NaCl/Nd$_2$O$_3$, NaCl/Sm$_2$O$_3$, NaCl/Eu$_2$O$_3$, NaCl/Gd$_2$O$_3$, NaCl/Tb$_2$O$_3$, NaCl/Dy$_2$O$_3$, NaCl/Ho$_2$O$_3$, NaCl/Er$_2$O$_3$, NaCl/Tm$_2$O$_3$, NaCl/Yb$_2$O$_3$, NaCl/Lu$_2$O$_3$, NaCl/Y$_2$O$_3$, KCl/MgO, KCl/CaO, KCl/SrO, KCl/BaO, KCl/La$_2$O$_3$, KCl/CeO$_2$, KCl/Pr$_2$O$_3$, KCl/Nd$_2$O$_3$, KCl/Sm$_2$O$_3$, KCEu$_2$O$_3$, KCl/Gd$_2$O$_3$, KCl/Tb$_2$O$_3$, KCl/Dy$_2$O$_3$, KCl/Ho$_2$O$_3$, KCl/Er$_2$O$_3$, KCl/Tm$_2$O$_3$, KCl/Yb$_2$O$_3$, KCl/Lu$_2$O$_3$, KCl/Y$_2$O$_3$, RbCl/MgO, RbCl/CaO, RbCl/SrO, RbCl/BaO, RbCl/La$_2$O$_3$, RbCl/CeO$_2$, RbCl/Pr$_2$O$_3$, RbCl/Nd$_2$O$_3$, RbCl/Sm$_2$O$_3$, RbCl/Eu$_2$O$_3$, RbCl/Gd$_2$O$_3$, RbCl/Tb$_2$O$_3$, RbCl/Dy$_2$O$_3$, RbCl/Ho$_2$O$_3$, RbCl/Er$_2$O$_3$, RbCl/Tm$_2$O$_3$, RbCl/Yb$_2$O$_3$, RbCl/Lu$_2$O$_3$, RbCl/Y$_2$O$_3$, CsCl/MgO, CsCl/CaO, CsCl/SrO, CsCl/BaO, CsCl/La$_2$O$_3$, CsCl/CeO$_2$, CsCl/Pr$_2$O$_3$, CsCl/Tb$_2$O$_3$, CsCl/Dy$_2$O$_3$, CsCl/Ho$_2$O$_3$, CsCl/Er$_2$O$_3$, CsCl/Tm$_2$O$_3$, CsCl/Yb$_2$O$_3$, CsCl/Lu$_2$O$_3$, and CsCl/Y$_2$O$_3$.

If a fluoride of a monovalent metal and a chloride of a divalent or trivalent metal are used for the first layer and the second layer respectively, a first layer/second layer structure is selected from the group including LiF/MgCl$_2$, LiF/CaCl$_2$, LiF/SrCl$_2$, LiF/BaCl$_2$, LiF/LaCl$_3$, LiF/CeCl$_3$, LiF/PrCL$_3$, LiF/NdCl$_3$, LiF/SmCl$_3$, LiF/EuCl$_3$, LiF/GdCl$_3$, LiF/TbCl$_3$, LiF/DyCl$_3$, LiF/HCl$_3$, LiF/ErCl$_3$, LiF/TmCl$_3$, LiF/YbCl$_3$, LiF/LuCl$_3$, LiF/YCl$_3$, NaF/MgCl$_2$, NaF/CaCl$_2$, NaF/SrCl$_2$, NaF/BaCl$_2$, NaF/LaCl$_3$, NaF/CeCl$_3$, NaF/PrCl$_3$, NaF/NdCl$_3$, NaF/SmCl$_3$, NaF/EuCl$_3$, NaF/GdCl$_3$, NaF/TbCl$_3$, NaF/DyCl$_3$, NaF/HCl$_3$, NaF/ErCl$_3$, NaF/TmCl$_3$, NaF/YbCl$_3$, NaF/LuCl$_3$, NaF/YCl$_3$, KF/MgCl$_2$, KF/CaCl$_2$, KF/SrCl$_2$, KF/BaCl$_2$, KF/LaCl$_3$, KF/CeCl$_3$, KF/PrCl$_3$, KF/NdCl$_3$, KF/SmCl$_3$, KF/EuCl$_3$, KF/GdCl$_3$, KF/TbCl$_3$, KF/DyCl$_3$, KF/HCl$_3$, KF/ErCl$_3$, KF/TmCl$_3$, KF/YbCl$_3$, KF/LuCl$_3$, KF/YC$_3$, RbF/MgCl$_2$, RbF/CaCl$_2$, RbF/SrCl$_2$, RbF/BaCl$_2$, RbF/LaCl$_3$, RbF/CeCl$_3$, RbF/PrCL$_3$, RbF/NdCl$_3$, RbF/SmCl$_3$, RbF/EuCl$_3$, RbF/GdCl$_3$, RbF/TbCl$_3$, RbF/DyCl$_3$, RbF/HCl$_3$, RbF/ErCl$_3$, RbF/TmCl$_3$, RbF/YbCl$_3$, RbF/LuCl$_3$, RbF/YCl$_3$, CsF/MgCl$_2$, CsF/CaCl$_2$, CsF/SrCl$_2$, CsF/BaCl$_2$, CsF/LaCl$_3$, CsF/CeCl$_3$, CsF/PrCl$_3$, CsF/NdCl$_3$, CsF/SmCl$_3$, CsF/EuCl$_3$, CsF/GdCl$_3$, CsF/TbCl$_3$, CsF/DyCl$_3$, CsF/HCl$_3$, CsF/ErCl$_3$, CsF/TmCl$_3$, CsF/YbCl$_3$, CsF/LuCl$_3$, and CsF/YCl$_3$.

If an oxide of a monovalent metal and a chloride of a divalent or trivalent metal are used for the first layer and the second layer respectively, a first layer/second layer structure is selected from the group including Li$_2$O/MgCl$_2$, Li$_2$O/CaCl$_2$, Li$_2$O/SrCl$_2$, Li$_2$O/BaCl$_2$, Li$_2$O/LaCl$_3$, Li$_2$O/CeCl$_3$, Li$_2$O/PrCl$_3$, Li$_2$O/NdCl$_3$, Li$_2$O/SmCl$_3$, Li$_2$O/EuCl$_3$, Li$_2$O/GdCl$_3$, Li$_2$O/TbCl$_3$, Li$_2$O/DyCl$_3$, Li$_2$O/HoCl$_3$, Li$_2$O/ErCl$_3$, Li$_2$O/TmCl$_3$, Li$_2$O/YbCl$_3$, Li$_2$O/LuCl$_3$, Li$_2$O/YCl$_3$, Na$_2$O/MgCl$_2$, Na$_2$O/CaCl$_2$, Na$_2$O/SrCl$_2$, Na$_2$O/BaCl$_2$, Na$_2$O/LaCl$_3$, Na$_2$O/CeCl$_3$, Na$_2$O/PrCl$_3$, Na$_2$O/NdCl$_3$, Na$_2$O/SmCl$_3$, Na$_2$O/EuCl$_3$, Na$_2$O/GdCl$_3$, Na$_2$O/TbCl$_3$, Na$_2$O/DyCl$_3$, Na$_2$O/HoCl$_3$, Na$_2$O/ErCl$_3$, Na$_2$O/TmCl$_3$, Na$_2$O/YbCl$_3$, Na$_2$O/LuCl$_3$, Na$_2$O/YCl$_3$, Rb$_2$O/MgCl$_2$, Rb$_2$O/CaCl$_2$, Rb$_2$O/SrCl$_2$, Rb$_2$O/BaCl$_2$, Rb$_2$O/LaCl$_3$, Rb$_2$O/CeCl$_3$, Rb$_2$O/PrCl$_3$, Rb$_2$O/NdCl$_3$, Rb$_2$O/SmCl$_3$, Rb$_2$O/EuCl$_3$, Rb$_2$O/GdCl$_3$, Rb$_2$O/TbCl$_3$, Rb$_2$O/DyCl$_3$, Rb$_2$O/HoCl$_3$, Rb$_2$O/ErCl$_3$, Rb$_2$O/TmCl$_3$, Rb$_2$O/YbCl$_3$, Rb$_2$O/LuCl$_3$, Rb$_2$O/YCl$_3$, Cs$_2$O/MgCl$_2$, Cs$_2$O/CaCl$_2$, Cs$_2$O/SrCl$_2$, Cs$_2$O/BaCl$_2$, Cs$_2$O/LaCl$_3$, Cs$_2$O/CeCl$_3$, Cs$_2$O/PrCl$_3$, Cs$_2$O/NdCl$_3$, Cs$_2$O/SmCl$_3$, Cs$_2$O/EuCl$_3$, Cs$_2$O/GdCl$_3$, Cs$_2$O/TbCl$_3$, Cs$_2$O/DyCl$_3$, Cs$_2$O/HoCl$_3$, Cs$_2$O/ErCl$_3$, Cs$_2$O/TmCl$_3$, Cs$_2$O/YbCl$_3$, Cs$_2$O/LuCl$_3$, and Cs$_2$O/YCl$_3$.

If a chloride of a monovalent metal and a chloride of a divalent or trivalent metal are used for the first layer and the second layer respectively, a first layer/second layer structure is selected from the group including LiCl/MgCl$_2$, LiCl/CaCl$_2$, LiCl/SrCl$_2$, LiCl/BaCl$_2$, LiCl/LaCl$_3$, LiCl/CeCl$_3$, LiCl/PrCl$_3$, LiCl/NdCl$_3$, LiCl/SmCl$_3$, LiCl/EuCl$_3$, LiCl/GdCl$_3$, LiCl/TbCl$_3$, LiCl/DyCl$_3$, LiCl/HoCl$_3$, LiCl/ErCl$_3$, LiCl/TmCl$_3$, LiCl/YbCl$_3$, LiCl/LuCl$_3$, LiCl/YCl$_3$, NaCl/MgCl$_2$, NaCl/CaCl$_2$, NaCl/SrCl$_2$, NaCl/BaCl$_2$, NaCl/LaCl$_3$, NaCl/CeCl$_3$, NaCl/PrCl$_3$, NaCl/NdCl$_3$, NaCl/SmCl$_3$, NaCl/EuCl$_3$, NaCl/GdCl$_3$, NaCl/TbCl$_3$, NaCl/DyCl$_3$, NaCl/HoCl$_3$, NaCl/ErCl$_3$, NaCl/TmCl$_3$, NaCl/YbCl$_3$, NaCl/LuCl$_3$, NaCl/YCl$_3$, KCl/MgCl$_2$, KCl/CaCl$_2$, KCl/SrCl$_2$, KCl/BaCl$_2$, KCl/LaCl$_3$, KCl/CeCl$_3$, KCl/PrCl$_3$, KCl/NdCl$_3$, KCl/SmCl$_3$, KCl/EuCl$_3$, KCl/GdCl$_3$, KCl/TbCl$_3$, KCl/DyCl$_3$, KCl/HoCl$_3$, KCl/ErCl$_3$, KCl/TmCl$_3$, KCl/YbCl$_3$, KCl/LuCl$_3$, KCl/YCl$_3$, RbCl/MgCl$_2$, RbCl/CaCl$_2$, RbCl/SrCl$_2$, RbCl/BaCl$_2$, RbCl/LaCl$_3$, RbCl/CeCl$_3$, RbCl/PrCl$_3$, RbCl/NdCl$_3$, RbCl/SmCl$_3$, RbCl/EuCl$_3$, RbCl/GdCl$_3$, RbCl/TbCl$_3$, RbCl/DyCl$_3$, RbCl/HoCl$_3$, RbCl/ErCl$_3$, RbCl/TmCl$_3$, RbCl/YbCl$_3$, RbCl/LuCl$_3$, RbCl/YCl$_3$, CsCl/MgCl$_2$, CsCl/CaCl$_2$, CsCl/SrCl$_2$, CsCl/BaCl$_2$, CsCl/LaCl$_3$, CsCl/CeCl$_3$, CsCl/PrCl$_3$, CsCl/NdCl$_3$, CsCl/SmCl$_3$, CsCl/EuCl$_3$, CsCl/GdCl$_3$, CsCl/TbCl$_3$, CsCl/DyCl$_3$, CsCl/HoCl$_3$, CsCl/ErCl$_3$, CsCl/TmCl$_3$, CsCl/YbCl$_3$, CsCl/LuCl$_3$, and CsCl/YCl$_3$.

If a fluoride of a divalent metal and a fluoride of a trivalent metal are used for the first layer and the second layer respectively, a first layer/second layer structure is selected from the group including $MgF_2/LaF_3$, $MgF_2/CeF_3$, $MgF_2/PrF_3$, $MgF_2/NdF_3$, $MgF_2/SmF_3$, $MgF_2/EuF_3$, $MgF_2/GdF_3$, $MgF_2/TbF_3$, $MgF_2/DyF_3$, $MgF_2/HoF_3$, $MgF_2/ErF_3$, $MgF_2/TmF_3$, $MgF_2/YbF_3$, $MgF_2/LuF_3$, $MgF_2/YF_3$, $CaF_2/LaF_3$, $CaF_2/CeF_3$, $CaF_2/PrF_3$, $CaF_2/NdF_3$, $CaF_2/SmF_3$, $CaF_2/EuF_3$, $CaF_2/GdF_3$, $CaF_2/TbF_3$, $CaF_2/DyF_3$, $CaF_2/HoF_3$, $CaF_2/ErF_3$, $CaF_2/TmF_3$, $CaF_2/YbF_3$, $CaF_2/LuF_3$, $CaF_2/YF_3$, $SrF_2/LaF_3$, $SrF_2/CeF_3$, $SrF_2/PrF_3$, $SrF_2/NdF_3$, $SrF_2/SmF_3$, $SrF_2/EuF_3$, $SrF_2/GdF_3$, $SrF_2/TbF_3$, $SrF_2/DyF_3$, $SrF_2/HoF_3$, $SrF_2/ErF_3$, $SrF_2/TmF_3$, $SrF_2/YbF_3$, $SrF_2/LuF_3$, $SrF_2/YF_3$, $BaF_2/LaF_3$, $BaF_2/CeF_3$, $BaF_2/PrF_3$, $BaF_2/NdF_3$, $BaF_2/SmF_3$, $BaF_2/EuF_3$, $BaF_2/GdF_3$, $BaF_2/TbF_3$, $BaF_2/DyF_3$, $BaF_2/HoF_3$, $BaF_2/ErF_3$, $BaF_2/TmF_3$, $BaF_2/YbF_3$, $BaF_2/LuF_3$, and $BaF_2/YF_3$.

If a chloride of a divalent metal and a fluoride of a trivalent metal are used for the first layer and the second layer respectively, a first layer/second layer structure is selected from the group including $MgCl_2/LaF_3$, $MgCl_2/CeF_3$, $MgCl_2/PrF_3$, $MgCl_2/NdF_3$, $MgCl_2/SmF_3$, $MgCl_2/EuF_3$, $MgCl_2/GdF_3$, $MgCl_2/TbF_3$, $MgCl_2/DyF_3$, $MgCl_2/HoF_3$, $MgCl_2/ErF_3$, $MgCl_2/TmF_3$, $MgCl_2/YbF_3$, $MgCl_2/LuF_3$, $MgCl_2/YF_3$, $CaCl_2/LaF_3$, $CaCl_2/CeF_3$, $CaCl_2/PrF_3$, $CaCl_2/NdF_3$, $CaCl_2/SmF_3$, $CaCl_2EuF_3$, $CaCl_2/GdF_3$, $CaCl_2/TbF_3$, $CaCl_2/DyF_3$, $CaCl_2/HoF_3$, $CaCl_2/ErF_3$, $CaCl_2/TmF_3$, $CaCl_2/YbF_3$, $CaCl_2/LuF_3$, $CaCl_2/YF_3$, $SrCl_2/LaF_3$, $SrCl_2/CeF_3$, $SrCl_2/PrF_3$, $SrCl_2/NdF_3$, $SrCl_2/SmF_3$, $SrCl_2/EuF_3$, $SrCl_2/GdF_3$, $SrCl_2/TbF_3$, $SrCl_2/DyF_3$, $SrCl_2/HoF_3$, $SrCl_2/ErF_3$, $SrCl_2/TmF_3$, $SrCl_2/YbF_3$, $SrCl_2/LuF_3$, $SrCl_2/YF_3$, $BaCl_2/LaF_3$, $BaCl_2/CeF_3$, $BaCl_2/PrF_3$, $BaCl_2/NdF_3$, $BaCl_2/SmF_3$, $BaCl_2/EuF_3$, $BaCl_2/GdF_3$, $BaCl_2/TbF_3$, $BaCl_2/DyF_3$, $BaCl_2/HoF_3$, $BaCl_2/ErF_3$, $BaCl_2/TmF_3$, $BaCl/YbF_3$, $BaCl_2/LuF_3$, and $BaCl_2/YF_3$.

If an oxide of a divalent metal and a fluoride of a trivalent metal are used for the first layer and the second layer respectively, a first layer/second layer structure is selected from the group including $MgO/LaF_3$, $MgO/CeF_3$, $MgO/PrF_3$, $MgO/NdF_3$, $MgO/SmF_3$, $MgO/EuF_3$, $MgO/GdF_3$, $MgO/TbF_3$, $MgO/DyF_3$, $MgO/HoF_3$, $MgO/ErF_3$, $MgO/TmF_3$, $MgO/YbF_3$, $MgO/LuF_3$, $MgO/YF_3$, $CaO/LaF_3$, $CaO/CeF_3$, $CaO/PrF_3$, $CaO/NdF_3$, $CaO/SmF_3$, $CaO/EuF_3$, $CaO/GdF_3CaO/TbF_3$, $CaO/DyF_3$, $CaO/HoF_3$, $CaO/ErF_3$, $CaO/TmF_3$, $CaO/YbF_3$, $CaO/LuF_3$, $CaO/YF_3$, $SrO/LaF_3$, $SrO/CeF_3$, $SrO/PrF_3$, $SrO/NdF_3$, $SrO/SmF_3$, $SrO/EuF_3$, $SrO/GdF_3$, $SrO/TbF_3$, $SrO/DyF_3$, $SrO/HoF_3$, $SrO/ErF_3$, $SrO/TmF_3$, $SrO/YbF_3$, $SrO/LuF_3$, $SrO/YF_3$, $BaO/LaF_3$, $BaO/CeF_3$, $BaO/PrF_3$, $BaO/NdF_3$, $BaO/SmF_3$, $BaO/EuF_3$, $BaO/GdF_3$, $BaO/TbF_3$, $BaO/DyF_3$, $BaO/HoF_3$, $BaO/ErF_3$, $BaO/TmF_3$, $BaO/YbF_3$, $BaO/LuF_3$, and $BaO/YF_3$.

If an oxide of a divalent metal and a chloride of a trivalent metal are used for the first layer and the second layer respectively, a first layer/second layer structure is selected from the group including $MgO/LaCl_3$, $MgO/CeCl_3$, $MgO/PrCl_3$, $MgO/NdCl_3$, $MgO/SmCl_3$, $MgO/EuCl_3$, $MgO/GdCl_3$, $MgO/TbCl_3$, $MgO/DyCl_3$, $MgO/HoCl_3$, $MgO/ErCl_3$, $MgO/TmCl_3$, $MgO/YbCl_3$, $MgO/LuCl_3$, $MgO/YCl_3$, $CaO/LaCl_3$, $CaO/CeCl_3$, $CaO/PrCl_3$, $CaO/NdCl_3$, $CaO/SmCl_3$, $CaO/EuCl_3$, $CaO/GdCl_3$, $CaO/TbCl_3$, $CaO/DyCl_3$, $CaO/HoCl_3$, $CaO/ErCl_3$, $CaO/TmCl_3$, $CaO/YbCl_3$, $CaO/LuCl_3$, $CaO/YCl_3$, $SrO/LaCl_3$, $SrO/CeCl_3$, $SrO/PrCl_3$, $SrO/NdCl_3$, $SrO/SmCl_3$, $SrO/EuCl_3$, $SrO/GdCl_3$, $SrO/TbCl_3$, $SrO/DyCl_3$, $SrO/HoCl_3$, $SrO/ErCl_3$, $SrO/TmCl_3$, $SrO/YbCl_3$, $SrO/LuCl_3$, $SrO/YCl_3$, $BaO/LaCl_3$, $BaO/CeCl_3$, $BaO/PrCl_3$, $BaO/NdCl_3$, $BaO/SmCl_3$, $BaO/EuCl_3$, $BaO/GdCl_3$, $BaO/TbCl_3$, $BaO/DyCl_3$, $BaO/HoCl_3$, $BaO/ErCl_3$, $BaO/TmCl_3$, $BaO/YbCl_3$, $BaO/LuCl_3$, and $BaO/YCl_3$.

If an oxide of a divalent metal and an oxide of a trivalent metal are used for the first layer and the second layer respectively, a first layer/second layer structure is selected from the group including $MgO/La_2O_3$, $MgO/CeO_2$, $MgO/Pr_2O_3$, $MgO/Nd_2O_3$, $MgO/Sm_2O_3$, $MgO/Eu_2O_3$, $MgO/Gd_2O_3$, $MgO/Tb_2O_3$, $MgO/Dy_2O_3$, $MgO/Ho_2O_3$, $MgO/Er_2O_3$, $MgO/Tm_2O_3$, $MgO/Yb_2O_3$, $MgO/Lu_2O_3$, $MgO/Y_2O_3$, $CaO/La_2O_3$, $CaO/CeO_2$, $CaO/Pr_2O_3$, $CaO/Nd_2O_3$, $CaO/Sm_2O_3$, $CaO/Eu_2O_3$, $CaO/Gd_2O_3$, $CaO/Tb_2O_3$, $CaO/Dy_2O_3$, $CaO/Ho_2O_3$, $CaO/Er_2O_3$, $CaO/Tm_2O_3$, $CaO/Yb_2O_3$, $CaO/Lu_2O_3$, $CaO/Y_2O_3$, $SrO/La_2O_3$, $SrO/CeO_2$, $SrO/Pr_2O_3$, $SrO/Nd_2O_3$, $SrO/Sm_2O_3$, $SrO/Eu_2O_3$, $SrO/Gd_2O_3$, $SrO/Tb_2O_3$, $SrO/Dy_2O_3$, $SrO/Ho_2O_3$, $SrO/Er_2O_3$, $SrO/Tm_2O_3$, $SrO/Yb_2O_3$, $SrO/Lu_2O_3$, $SrO/Y_2O_3$, $BaO/La_2O_3$, $BaO/CeO_2$, $BaO/Pr_2O_3$, $BaO/Nd_2O_3$, $BaO/Sm_2O_3$, $BaO/Eu_2O_3$, $BaO/Gd_2O_3$, $BaO/Tb_2O_3$, $BaO/Dy_2O_3$, $BaO/Ho_2O_3$, $BaO/Er_2O_3$, $BaO/Tm_2O_3$, $BaO/Yb_2O_3$, $BaO/Lu_2O_3$, and $BaO/Y_2O_3$.

The first and second layers may each have a thickness in the range of about 50 to 200 nm.

By specifying the deposition order of metal compounds according to the valences of the metal elements of the metal compounds, not only are the same effects as in the foregoing exemplary embodiment produced, but also electrons are efficiently injected and transported to the luminescent layer to exhibit superior luminescence characteristics due to the difference between the valence of the metal elements.

3. Order Specified According to Ionic Radiuses of the Metal Ions of the Metal Compounds Metal compounds are deposited in such an order that the metal of the second layer has an ionic radius larger than that of the metal of the first layer.

Therefore, a combination of the first and second layers may be selected from the group including $LiF/SrF_2$, $LiF/BaF_2$, $LiF/CaF_2$, $LiF/CsF$, $LiF/NaF$, $LiF/KF$, $MgF_2/CaF_2$, $MgF_2/SrF_2$, $MgF_2/SrF_2$, $MgF_2/BaF_2$, $CaF_2/SrF_2$, and $SrF_2/BaF_2$.

Preferably, the first and second layers each have a thickness in the range of about 50 to 200 nm.

By specifying the deposition order of metal compounds according to the ionic radiuses of the metals of the metal compounds, not only are the same effects as in the foregoing exemplary embodiment produced, but also electrons are efficiently injected and transported to the luminescent layer to exhibit superior luminescence characteristics due to the difference between the ionic radiuses of the metals.

4. Order Specified According to the Work Functions of the Metals of the Metal Compounds Metal compounds are deposited in such an order that the metal elements of the second layer has a work function higher than that of the metal elements of the first layer.

Therefore, it is preferable that a combination of the first and second layers is selected from the group including $LiF/MgF_2$, $LiF/YF_3$, $LiF/LaF_3$, $LiF/YF_3$, $LiF/LaF_3$, $LiF/TbF_3$, $LiF/ErF_3$, $CsF/RbF$, $CsF/KF$, $CsF/NaF$, $CsF/LiF$, $RbF/KF$, $Rb/NaF$, $RbF/LiF$, $KF/NaF$, $KF/LiF$, $NaF/LiF$, $SrF_2/BaF_2$, $SrF_2/CaF_2$, $SrF_2/MgF_2$, $BaF_2/CaF_2$, $CaF_2/MgF_2$, $EuF_3/YF_3$, $EuF_3/LaF_3$, $EuF_3/CeF_3$, $EuF_3/SmF_3$, $EuF_3/GdF_3$, $EuF_3/TbF_3$, $EuF_3/ErF_3$, $EuF_3/YbF_3$, $SmF_3/YF_3$, $SmF_3/LaF_3$, $SmF_3/CeF_3$, $SmF_3/GdF_3$, $SmF_3/TbF_3$, $SmF_3/ErF_3$, $SmF_3/YbF_3$, $YbF_3/YF_3$, $YbF_3/LaF_3$, $YbF_3/CeF_3$, $YbF_3/GdF_3$, $YbF_3/TbF_3$, $YbF_3/ErF_3$, $TbF_3/YF_3$, $TbF_3/LaF_3$, $TbF_3/CeF_3$, $TbF_3/GdF_3$, $TbF_3/ErF_3$, $GdF_3/YF_3$, $GdF_3/LaF_3$, $GdF_3/CeF_3$, $GdF_3/ErF_3$, $ErF_3/YF_3$, $ErF_3/LaF_3$, $ErF_3/CeF_3$, and $LaF_3/YF_3$.

Preferably, the first and second layers each have a thickness in the range of about 50 to 200 nm.

By specifying the deposition order of metal compounds according to the work functions of the metal elements of the metal compounds, not only are the same effects as in the foregoing exemplary embodiment produced, but also electrons are efficiently injected and transported to the luminescent layer to exhibit superior luminescence characteristics due to the difference between the work functions of the metal elements.

Third Exemplary Embodiment

Electronic apparatuses including an EL display device according to the first or second exemplary embodiment will now be described with reference to FIG. 15.

Figure 15A:
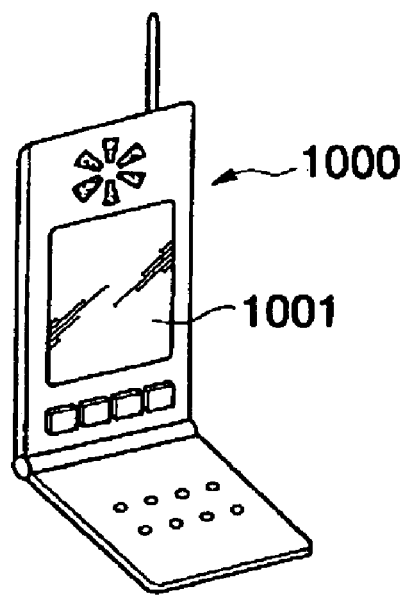
FIGS. 15(A)–15(C) are a representation of electronic apparatuses according to a third exemplary embodiment.

FIG. 15(A) is a perspective view of a cellular phone. In FIG. 15(A), reference numerals 1000 and 1001 represent a body of the cellular phone and a display using an EL display device described above, respectively.

Figure 15B:
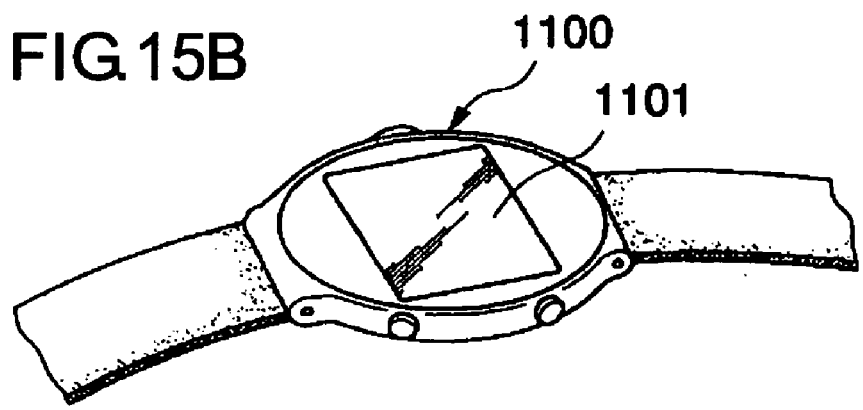

FIG. 15(B) is a perspective view of a wristwatch type electronic apparatus. In FIG. 15(B), reference numerals 1100 and 1101 represent a body of the wristwatch and a display using an EL display device described above, respectively.

Figure 15C:
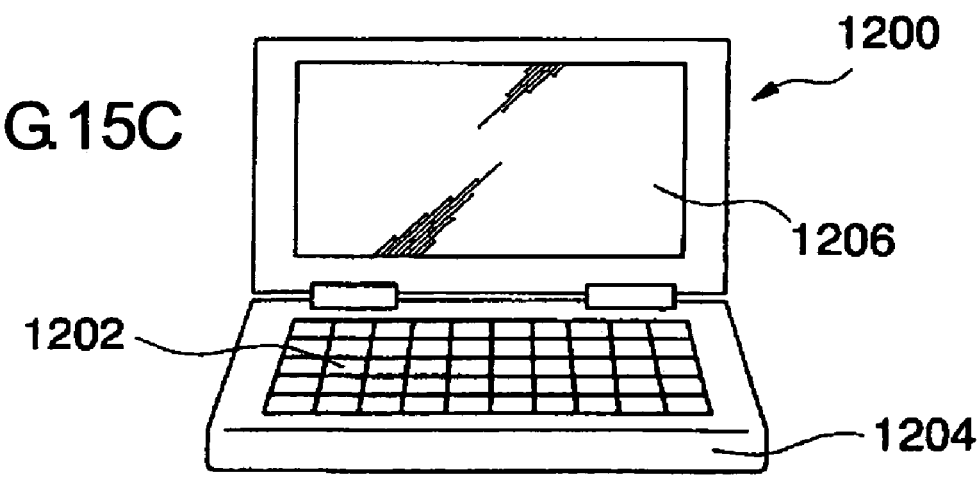

FIG. 15(C) is a perspective view of a portable information processing apparatus, such as a word processor or a personal computer. In FIG. 15(C), reference numerals 1200, 1202, 1204, and 1206 represent the information processing apparatus, an input region such as a keyboard, a body of the information processing apparatus, and a display including an EL display device described above, respectively.

Each of the electronic apparatuses shown in FIGS. 15(A) to 15(C) includes the EL display device according to the first exemplary embodiment. Accordingly, these apparatuses exhibit the characteristic features of the EL display device of the foregoing first exemplary embodiment; hence, they are superior electronic apparatuses.

Such an electronic apparatus is manufactured by embedding the EL display device 1 according to the first or second exemplary embodiment in the display portion of an electronic apparatus, such as a cellular phone, a potable information processing apparatus, or a wristwatch type electronic apparatus.

What is claimed is:

1. An electro-optic device, comprising:
    a plurality of anodes;
    a cathode;
    plural types of luminescent layers emitting different colors of light and lying between the plurality of anodes and the cathode; and
    an electron injection layer lying between the plural types of luminescent layers and the cathode, the electron injection layer including at least a first metal compound and a second metal compound and both the first metal compound and the second metal compound including a metal element selected from the group consisting of alkali metals, alkaline earth metals, and rare earth metals.

2. The electro-optic device according to claim 1, both the first metal compound and the second metal compound being one of a fluoride, an oxide, and a chloride of the metal element.

3. The electro-optic device according to claim 1, the electron injection layer being mixed layer of at least a first metal compound and a second metal compound.

4. The electro-optic device according to claim 1, the electron injection layer comprising at least a first layer and a second layer lying between the first layer and the cathode, the first layer including the first compound and the second layer including the second compound.

5. The electro-optic device according to claim 4, the second compound having a chemical bonding force larger than that of the first compound.

6. The electro-optic device according to claim 4, the metal element of the second compound having a valence higher than that of the first compound.

7. The electro-optic device according to claim 4, the metal element of the second compound having an ionic radius larger than that of the first compound.

8. The electro-optic device according to claim 4, the metal element of the second compound having a work function higher than that of the first compound.

9. The electro-optic device according to claim 1, the cathode being in contact with the electron injection layer and containing a metal reducing the metal compounds of the electron injection layer.

10. An electronic apparatus including an electro-optic device as set forth in claim 1.

11. A method to manufacture an electro-optic device including plural types of luminescent layers emitting different colors of light, an electron injection layer, and a cathode, the method comprising:
    forming the electron injection layer including at least a first metal compound and a second metal compound, both the first metal compound and the second metal compound including a metal element selected from the group consisting of alkali metals, alkaline earth metals, and rare earth metals.

12. The method to manufacture the electro-optic device, according to claim 11, the formation of the electron injection layer being performed by mixing at least the first metal compound and the second metal compound.

13. The method to manufacture the electro-optic device, according to claim 12, the formation of the electron injection layer being performed by forming a first layer including the first compound and forming a second layer including the second compound on the first layer.

14. The method to manufacture the electro-optic device, according to claim 13, the second compound having a chemical bonding force larger than that of the first compound.

15. The method to manufacture the electro-optic device, according to claim 13, the metal element of the second compound having a valence higher than that of the first compound.

16. The method to manufacture the electro-optic device, according to claim 13, the metal element of the second compound having an ionic radius larger than that of the first compound.

17. The method to manufacture the electro-optic device, according to claim 13, the metal element of the second compound having a work function higher than that of the first compound.

18. The method to manufacture the electro-optic device, according to claim 11, the method further comprising forming the cathode of a metal reducing the metal compounds of the electron injection layer.

19. An electro-optic device, comprising:
    a plurality of anodes;

a first luminescent layer formed above at least one of the plurality of anodes;

a second luminescent layer fanned above the other of the plurality of anodes;

an electron injection layer fanned corresponding to the first luminescent layer and the second luminescent layer in common; and a cathode formed above the electron injection layer, the electron injection layer including at least a first metal compound and a second metal compound, and both the first metal compound and the second metal compound including a metal element selected from the group consisting of alkali metals, alkaline earth metals, and rare earth metals.

20. An electro-optic device, comprising:

a plurality of anodes;

a first luminescent layer formed above at least one of the plurality of anodes;

a second luminescent layer formed above the other of the plurality of anodes;

an electron injection layer formed corresponding to the first luminescent layer and the second luminescent layer in common, the electron injection layer including Li and Sr; and a cathode formed above the electron injection layer.

* * * * *